(12) United States Patent
Ohhashi et al.

(10) Patent No.: US 12,224,723 B2
(45) Date of Patent: *Feb. 11, 2025

(54) HIGH FREQUENCY POWER AMPLIFICATION DEVICE

(71) Applicant: Nuvoton Technology Corporation Japan, Kyoto (JP)

(72) Inventors: Kazuhiko Ohhashi, Osaka (JP); Masatoshi Kamitani, Osaka (JP)

(73) Assignee: NUVOTON TECHNOLOGY CORPORATION JAPAN, Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/583,589

(22) Filed: Feb. 21, 2024

(65) Prior Publication Data
US 2024/0195369 A1 Jun. 13, 2024

Related U.S. Application Data

(63) Continuation of application No. 18/264,548, filed as application No. PCT/JP2022/006393 on Feb. 17, 2022.

(Continued)

(51) Int. Cl.
*H03F 1/07* (2006.01)
*H03F 1/02* (2006.01)
(Continued)

(52) U.S. Cl.
CPC ........... *H03F 3/245* (2013.01); *H03F 1/0288* (2013.01); *H03F 1/26* (2013.01); *H03F 2200/451* (2013.01); *H03F 2203/21127* (2013.01)

(58) Field of Classification Search
CPC ........................................................ H03F 1/07
(Continued)

(56) References Cited

U.S. PATENT DOCUMENTS 5,546,048 A    8/1996    Sano et al.
7,619,468 B1    11/2009    Bowles et al.
(Continued)

FOREIGN PATENT DOCUMENTS

JP    H04-150202 A    5/1992
JP    H06-245174 A    9/1994
(Continued)

OTHER PUBLICATIONS

International Search Report dated May 10, 2022 issued in International Patent Application No. PCT/JP2022/006393, with English translation.

(Continued)

*Primary Examiner* — Henry Choe
(74) *Attorney, Agent, or Firm* — Rimon P.C.

(57) ABSTRACT

A radio-frequency power amplifier device includes: a carrier amplifier semiconductor device and a peak amplifier semiconductor device on a multilayer submount substrate; a bias power supply semiconductor device; second radio-frequency signal wiring that transmits radio-frequency signal to the carrier amplifier semiconductor device and the peak amplifier semiconductor device; and carrier-amplifier bias power supply wiring that is wired in a third wiring layer and supplies a bias power supply voltage. The second radio-frequency signal wiring and the carrier-amplifier bias power supply wiring intersect in a plan view. The radio-frequency power amplifier device includes: a shield pattern that is located in a second wiring layer between a first wiring layer and the third wiring layer; and one or more connection vias disposed in an extension direction of the carrier-amplifier bias power supply wiring. The one or more connection vias are connected to the shield pattern.

17 Claims, 14 Drawing Sheets

Related U.S. Application Data

(60) Provisional application No. 63/150,757, filed on Feb. 18, 2021.

(51) Int. Cl.
*H03F 1/26* (2006.01)
*H03F 3/24* (2006.01)

(58) Field of Classification Search
USPC .................................. 330/124 R, 295, 307
See application file for complete search history.

(56) References Cited

U.S. PATENT DOCUMENTS

| | | |
|---|---|---|
| 7,990,223 B1 | 8/2011 | Takagi |
| 2001/0035803 A1 | 11/2001 | Matsumura et al. |
| 2002/0063600 A1 | 5/2002 | Dohata |
| 2008/0099887 A1 | 5/2008 | Song et al. |
| 2014/0167292 A1 | 6/2014 | Masumura et al. |
| 2016/0049910 A1 | 2/2016 | Datta et al. |
| 2016/0373085 A1 | 12/2016 | Barbieri et al. |
| 2017/0126181 A1 | 5/2017 | Embar et al. |
| 2022/0329209 A1* | 10/2022 | Hashinaga ................. H03F 3/19 |
| 2023/0308121 A1* | 9/2023 | Ono ......................... H01L 25/18 |
| 2023/0319984 A1* | 10/2023 | Harada ................ H04B 1/0458 |
| | | 361/782 |

FOREIGN PATENT DOCUMENTS

| | | |
|---|---|---|
| JP | H09-153701 A | 6/1997 |
| JP | 2001-313536 A | 11/2001 |
| JP | 2002-164701 A | 6/2002 |
| JP | 2004-304628 A | 10/2004 |
| JP | 2007-135015 A | 5/2007 |
| JP | 2008-112992 A | 5/2008 |
| JP | 2010-098439 A | 4/2010 |
| JP | 2011-250360 A | 12/2011 |
| JP | 2012-504355 A | 2/2012 |
| JP | 2013-192178 A | 9/2013 |
| JP | 2014-120593 A | 6/2014 |
| JP | 2016-042695 A | 3/2016 |
| WO | 2010/037212 A1 | 4/2010 |

OTHER PUBLICATIONS

International Preliminary Report on Patentability Chapter II (IPRP2) dated Jan. 31, 2023 issued in International Patent Application No. PCT/JP2022/006393, with English translation.
Notice of Allowance dated Nov. 22, 2023 issued in U.S. Appl. No. 18/264,548.

* cited by examiner

HIGH FREQUENCY POWER AMPLIFICATION DEVICE

CROSS-REFERENCE OF RELATED APPLICATIONS

This application is a Continuation of U.S. patent application Ser. No. 18/264,548, filed on Aug. 7, 2023, now U.S. Pat. No. 11,942,911, which is the U.S. National Phase under 35 U.S.C. § 371 of International Patent Application No. PCT/JP2022/006393, filed on Feb. 17, 2022, which in turn claims the benefit of U.S. Provisional Patent Application No. 63/150,757, filed on Feb. 18, 2021, the entire disclosures of which Applications are incorporated by reference herein.

TECHNICAL FIELD

The present disclosure relates to a radio-frequency power amplifier device used in an apparatus that transmits radio-frequency signals.

BACKGROUND ART

In wireless communication base stations of recent year, there has been a demand for a high-output and highly efficient radio-frequency power amplifier device. A Doherty amplifier configured by combining a carrier amplifier that performs class AB operation or class B operation and a peak amplifier that performs class C operation is used as a highly efficient power amplifier used for a radio-frequency power amplifier. In the Doherty amplifier, only the carrier amplifier operates at a time when output power is low, both the carrier amplifier and the peak amplifier operate at a time when output power is high, and output signals of the carrier amplifier and the peak amplifier are synthesized.

When a power amplifier is caused to operate in a non-linear region, distortion occurs in an output signal. Since this distortion leaks out as an unnecessary signal to an adjacent channel, which deteriorates the quality of communication, this situation becomes an especially huge problem in a mobile phone system. Accordingly, digital predistortion (hereinafter abbreviated as DPD) in which distortion is compensated by inputting, to a power amplifier, a signal to which distortion having an inverse property is added in advance is generally used.

On the other hand, in order to increase the speed of signal transmission, massive multiple-input and multiple-output (MIMO) in which many radio-frequency power amplifier devices and antenna devices are used has been studied. In the massive MIMO, since many radio-frequency power amplifier devices are installed for one base station, there has been a demand for downsizing a radio-frequency power amplifier device and reducing the number of adjustment steps. A signal amplifier (radio-frequency power amplifier device) on which a bias control circuit is mounted to reduce the number of adjustment steps has been proposed (see Patent Literature (PTL) 1).

However, in order for a DPD system to perform distortion compensation, a radio-frequency power amplifier device needs interference prevention for preventing noise generated from an analog circuit and a digital circuit from affecting a radio-frequency signal. Various interference prevention techniques have been proposed to prevent noise from other signal circuits from affecting a radio-frequency signal. For example, PTL 2 proposes a semiconductor package that blocks out noise between circuit blocks by arranging, separately from signal circuits, a plurality of grounded vias between analog circuit blocks to which analog signals including radio-frequency (RF) signals are transmitted and digital circuit blocks to which digital signals are transmitted. In addition, PTL 3 proposes a radio-frequency module (radio-frequency power amplifier device) that prevents interference between a radio-frequency signal and a digital signal by mounting a radio-frequency circuit and a digital circuit on one surface layer and an other surface layer of a multilayer substrate, respectively, and providing a solid ground layer in a metal layer that is an inner layer, and reduces the effect of the noise of the digital signal.

CITATION LIST

Patent Literature

[PTL 1] Japanese Unexamined Patent Application Publication No. 2012-504355
[PTL 2] Japanese Unexamined Patent Application Publication No. 2008-112992
[PTL 3] Japanese Unexamined Patent Application Publication No. 2010-098439

SUMMARY OF INVENTION

Technical Problem

Since a power amplifier and a bias power supply semiconductor device that supplies a bias power supply voltage to the power amplifier are mounted on the same submount substrate, a radio-frequency power amplifier device containing a bias circuit needs measures for interference between bias power supply wiring that supplies the bias power supply voltage to the power amplifier and radio-frequency signal wiring. In particular, when the bias power supply wiring and the radio-frequency signal wiring are provided in different layers of the submount substrate, and have an intersection portion in a plan view, the measures for interference are important.

Although PTL 2 discloses a technique for blocking out noise between blocks in a planar direction of a submount substrate by providing a plurality of vias between digital circuit blocks and analog circuit blocks to which analog signals including radio-frequency signals are transmitted, it is difficult to prevent interference between upper and lower layers of the submount substrate using the technique, the plurality of vias being grounded separately from grounding of circuits. Moreover, although PTL 3 discloses a technique for implementing measures for interference between upper and lower layers by providing a solid ground layer in an inner layer of a submount substrate, since a bias power supply semiconductor device and a power amplifier are mounted on the same submount substrate, it is difficult to perform intersignal interference prevention merely by providing the solid ground layer in the inner layer. Furthermore, PTL 1 also fails to disclose interference measures in a radio-frequency power amplifier device in which bias power supply wiring and radio-frequency signal wiring have an intersection portion in a plan view.

In view of the above, the present disclosure provides a radio-frequency power amplifier device on which a Doherty amplifier and a bias power supply semiconductor device that supplies a bias power supply voltage to the Doherty amplifier are mounted, and which is capable of reducing interference between bias power supply wiring and radio-frequency signal wiring.

Solution to Problem

A radio-frequency power amplifier device according to one aspect of the present disclosure that is a radio-frequency power amplifier device of a hybrid type that includes a first principal surface of a multilayer submount substrate and a second principal surface facing the first principal surface and in which a carrier amplifier semiconductor device and a peak amplifier semiconductor device are disposed on the first principal surface, the multilayer submount substrate including a plurality of resin layers and a plurality of wiring layers, the radio-frequency power amplifier device including: a bias power supply semiconductor device that outputs a carrier-amplifier bias power supply voltage to the carrier amplifier semiconductor device, and outputs a peak-amplifier bias power supply voltage to the peak amplifier semiconductor device; radio-frequency signal wiring that is wired in a first wiring layer provided on the first principal surface of the multilayer submount substrate, and transmits a radio-frequency signal to the carrier amplifier semiconductor device or the peak amplifier semiconductor device; and bias power supply wiring that is wired in a third wiring layer of the multilayer submount substrate, and supplies the carrier-amplifier bias power supply voltage outputted from the bias power supply semiconductor device to the carrier amplifier semiconductor device or supplies the peak-amplifier bias power supply voltage outputted from the bias power supply semiconductor device to the peak amplifier semiconductor device, wherein the bias power supply semiconductor device includes an intersection portion in which the radio-frequency signal wiring and the bias power supply wiring intersect in a plan view of the multilayer submount substrate, the radio-frequency power amplifier device further includes: a shield pattern disposed in a region including the intersection portion that is included in a second wiring layer located between the first wiring layer and the third wiring layer, the shield pattern being set to a ground electric potential; and one or more connection vias disposed on each of both sides of a width of the bias power supply wiring in an extension direction of the bias power supply wiring, and the one or more connection vias on each of the both sides are connected to the shield pattern.

Advantageous Effects of Invention

According to one aspect of the present disclosure, it is possible to provide a radio-frequency power amplifier device on which a Doherty amplifier and a bias power supply semiconductor device that supplies a bias power supply voltage to the Doherty amplifier are mounted, and which is capable of reducing interference between bias power supply wiring and radio-frequency signal wiring.

DESCRIPTION OF EMBODIMENTS

Hereinafter, a radio-frequency power amplifier device according to embodiments will be described with reference to the drawings. It should be noted that the embodiments described below each show a specific example of the present disclosure. The values, shapes, materials, constituent elements, the arrangement and connection of the constituent elements, etc. in the following embodiments are mere examples, and therefore are not intended to limit the scope of the present disclosure. Additionally, among the constituent elements in the following embodiments, those not recited in any one of the independent claims indicating the broadest concepts are described as optional constituent elements.

Moreover, the respective figures are schematic diagrams and are not necessarily precise illustrations. In the figures, elements that are essentially the same have the same reference signs, and duplicate description may be omitted or simplified.

Furthermore, in the Description, the terms "above" and "below" in the configuration of a radio-frequency power amplifier device do not refer to the upward (vertically upward) direction and downward (vertically downward) in terms of absolute space. Those terms are defined by relative positional relationships based on a stacking order in a stacked structure. Moreover, the terms "above" and "below" apply not only when two constituent elements are disposed spaced apart and some other constituent element is interposed between the two constituent elements, but also when two constituent elements are disposed in close proximity to each other such that the two constituent elements are in contact with each other.

Furthermore, in the Description and the drawings, an X-axis, a Y-axis, and a Z-axis represent three axes of a right-handed three-dimensional Cartesian coordinate system. In each embodiment, a stacked direction of each resin layer in a multilayer submount substrate included in a radio-frequency power amplifier device is a Z-axis direction, and two axes parallel to a principal surface of the multilayer submount substrate are an X-axis direction and a Y-axis direction. In addition, a "plan view" in the Description refers to a view of the radio-frequency power amplifier device from the Z-axis direction.

Moreover, in the Description, terms indicating relationships between elements, such as "orthogonal" and "the same", terms indicating the shapes of elements, such as "rectangular" and "obround", numerical values, and numerical value ranges are not expressions that indicate only the strict meanings but are expressions that mean substantially equivalent ranges and include, for example, an error of approximately several percent (e.g., approximately 10%).

Furthermore, in the Description, "disposed" is an expression meaning "placed", "mounted", "provided", or "wired".

Embodiment 1

Figure 1A:
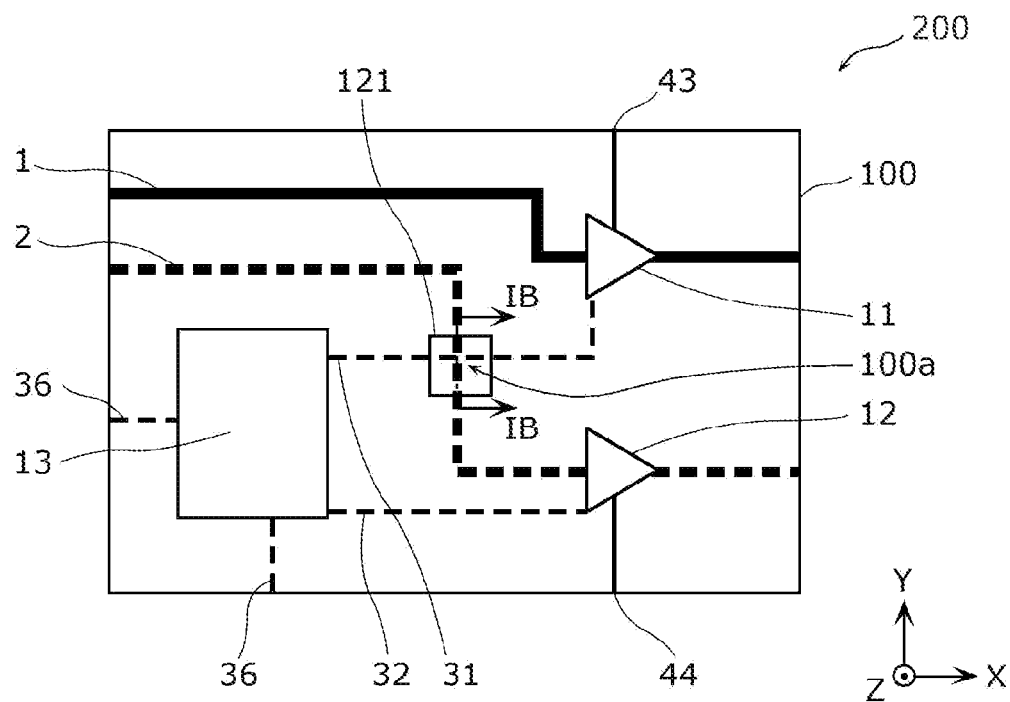
FIG. 1A shows an example of a plan view of a radio-frequency power amplifier device according to Embodiment 1.
Figure 1B:
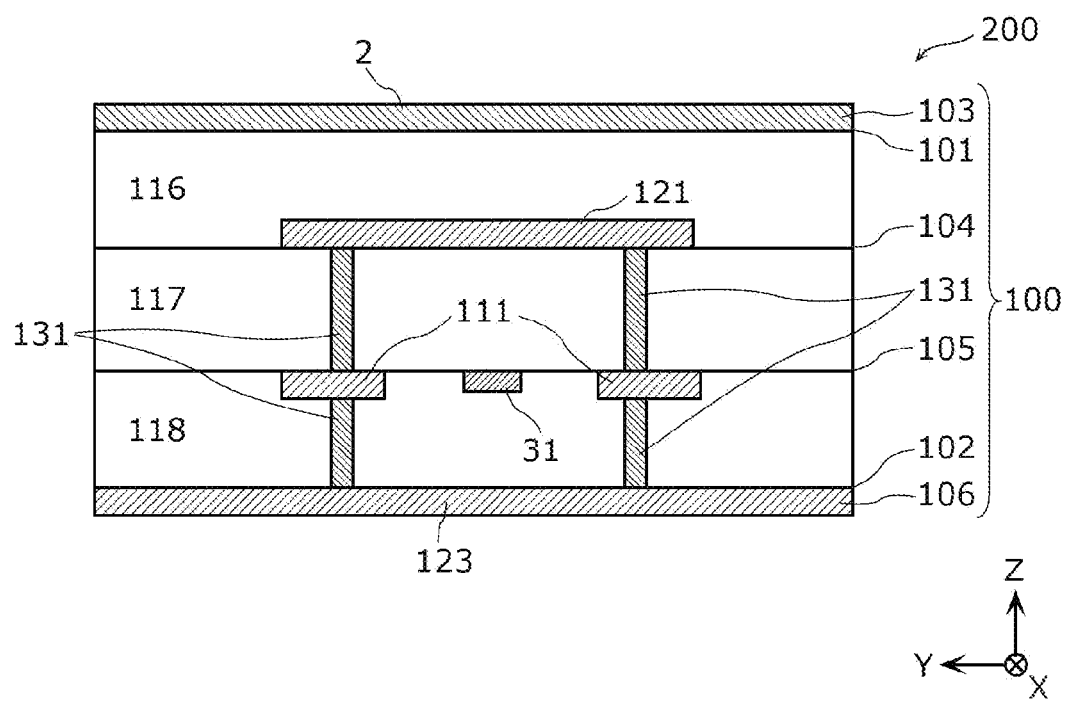
FIG. 1B shows an example of a cross sectional structural view of the radio-frequency power amplifier device according to Embodiment 1, taken along section line IB-IB in FIG. 1A.

A radio-frequency power amplifier device according to Embodiment 1 will be described with reference to FIG. 1A to FIG. 1C. FIG. 1A shows an example of a plan view of radio-frequency power amplifier device 200 according to Embodiment 1. FIG. 1B shows an example of a cross sectional structural view of radio-frequency power amplifier device 200 according to Embodiment 1, taken along section line IB-IB in FIG. 1A. In FIG. 1B, hatching of each of resin layers (first resin layer 116, second resin layer 117, third resin layer 118) is omitted for the sake of simplicity.

Multilayer submount substrate 100 is a stacked substrate in which a plurality of resin layers (e.g., epoxy-based resin layers) are stacked, and is a multilayer submount substrate including three resin layers (first resin layer 116, second resin layer 117, and third resin layer 118) in Embodiment 1. Multilayer submount substrate 100 is produced by stacking, for example, prepreg layers and metal layers (wiring layers) above and below a core substrate (a single-layer substrate covered on both surfaces with metal) as the center. In Embodiment 1, multilayer submount substrate 100 is a resin triple-layer and metal quadruple-layer substrate in which metal layers and resin layers are alternately stacked. It should be noted that the number of resin layers of multilayer submount substrate 100 is not limited to three, and may be at least two. Moreover, a method of preparing multilayer submount substrate 100 and a resin material are not limited to the above examples.

Multilayer submount substrate 100 includes: first resin layer 116; second resin layer 117; third resin layer 118; first wiring layer 103 on a first principal surface 101 side (a Z-axis plus side) of first resin layer 116; second wiring layer 104 between first resin layer 116 and second resin layer 117; third wiring layer 105 between second resin layer 117 and third resin layer 118; and fourth wiring layer 106 on a second principal surface 102 side (a Z-axis minus side) of third resin layer 118.

Multilayer submount substrate 100 includes the following mounted on first principal surface 101: carrier amplifier semiconductor device 11 for amplifying a first radio-frequency signal; peak amplifier semiconductor device 12 for amplifying a second radio-frequency signal; and bias power supply semiconductor device 13 that supplies a bias power supply voltage to carrier amplifier semiconductor device 11 and peak amplifier semiconductor device 12. Radio-frequency power amplifier device 200 is a radio-frequency power amplifier device of a hybrid type (Doherty type) in which carrier amplifier semiconductor device 11 and peak amplifier semiconductor device 12 are disposed (provided). Carrier amplifier semiconductor device 11 and peak amplifier semiconductor device 12 each are also referred to as a Doherty amplifier.

Carrier amplifier semiconductor device 11 is an amplifier that performs class AB operation or class B operation and amplifies a first radio-frequency signal, and operates in the entire output power range of radio-frequency power amplifier device 200. Carrier amplifier semiconductor device 11 is a semiconductor chip including an amplifier (carrier amplifier). Peak amplifier semiconductor device 12 is an amplifier that performs class C operation and amplifies a second radio-frequency signal, and operates only in an operating range in which the output power of radio-frequency power amplifier device 200 is high. Peak amplifier semiconductor device 12 is a semiconductor chip including an amplifier (peak amplifier).

Carrier amplifier semiconductor device 11 is supplied with a power supply voltage via carrier amplifier power supply wiring 43, and peak amplifier semiconductor device 12 is supplied with a power supply voltage via peak amplifier power supply wiring 44. Carrier amplifier power supply wiring 43 is connected to the drain electrode of an amplifier included in carrier amplifier semiconductor device 11, and peak amplifier power supply wiring 44 is connected to the drain electrode of an amplifier included in peak amplifier semiconductor device 12.

Bias power supply semiconductor device 13 comprises, for example, gallium arsenide (GaAs), and is configured to output a carrier-amplifier bias power supply voltage and a peak-amplifier bias power supply voltage to carrier amplifier semiconductor device 11 and peak amplifier semiconductor device 12, respectively, and to control these bias power supply voltages independently of each other. Bias power supply semiconductor device 13 is a semiconductor chip capable of outputting a carrier-amplifier bias power supply voltage and a peak-amplifier bias power supply voltage.

Radio-frequency power amplifier device 200 includes first radio-frequency signal wiring 1 and second radio-frequency signal wiring 2 as radio-frequency signal wiring.

First radio-frequency signal wiring 1 through which the first radio-frequency signal passes is provided in first wiring layer 103 provided on first principal surface 101 of multilayer submount substrate 100. First radio-frequency signal wiring 1 transmits the first radio-frequency signal to carrier amplifier semiconductor device 11. The first radio-frequency signal is an example of a radio-frequency signal.

Second radio-frequency signal wiring 2 through which the second radio-frequency signal passes is provided in first wiring layer 103 provided on first principal surface 101 of multilayer submount substrate 100. Second radio-frequency signal wiring 2 transmits the second radio-frequency signal to peak amplifier semiconductor device 12. The second radio-frequency signal is an example of a radio-frequency signal.

Radio-frequency power amplifier device 200 includes carrier-amplifier bias power supply wiring 31 and peak-amplifier bias power supply wiring 32.

Carrier-amplifier bias power supply wiring 31 to which the carrier-amplifier bias power supply voltage outputted from bias power supply semiconductor device 13 is supplied is provided in third wiring layer 105. Carrier-amplifier bias power supply wiring 31 supplies the carrier-amplifier bias power supply voltage to carrier amplifier semiconductor device 11. In Embodiment 1, the carrier-amplifier bias power supply voltage is directly applied to the gate electrode of the amplifier included in carrier amplifier semiconductor device 11. The carrier-amplifier bias power supply voltage is a bias voltage (gate bias voltage) supplied to the amplifier included in carrier amplifier semiconductor device 11.

Peak-amplifier bias power supply wiring 32 to which the peak-amplifier bias power supply voltage outputted from bias power supply semiconductor device 13 is supplied is provided in third wiring layer 105. Peak-amplifier bias power supply wiring 32 supplies the peak-amplifier bias power supply voltage to peak amplifier semiconductor device 12. In Embodiment 1, the peak-amplifier bias power supply voltage is directly applied to the gate electrode of the amplifier included in peak amplifier semiconductor device 12. The peak-amplifier bias power supply voltage is a bias voltage (gate bias voltage) supplied to the amplifier included in peak amplifier semiconductor device 12.

Bias power supply semiconductor device 13 is connected to analog power supply wiring 36. Analog power supply wiring 36 is power supply wiring for connecting bias power supply semiconductor device 13 and an external device (control device) of radio-frequency power amplifier device 200, and supplies a power supply voltage to bias power supply semiconductor device 13.

Second radio-frequency signal wiring 2 and carrier-amplifier bias power supply wiring 31 intersect in a plan view. In Embodiment 1, second radio-frequency signal wiring 2 and carrier-amplifier bias power supply wiring 31 are orthogonal at an intersection portion thereof in the plan view. It can also be said that radio-frequency power amplifier device 200 includes intersection portion 100a including a structure in which radio-frequency signal wiring and bias power supply wiring intersect (three-dimensionally intersect) in a plan view of multilayer submount substrate 100.

When the second radio-frequency signal of peak amplifier semiconductor device 12 and a carrier-amplifier-semiconductor bias power supply signal (e.g., a carrier-amplifier bias power supply voltage) interfere, the operation of carrier amplifier semiconductor device 11 or peak amplifier semiconductor device 12 becomes unstable. Moreover, a problem such as no distortion compensation by DPD (no low distortion characteristics achieved) occurs. Accordingly, it is possible to reduce intersignal interference by arranging sets of signal wiring to be mutually orthogonal to reduce an overlapping portion in a plan view. Additionally, it is possible to further reduce the intersignal interference by disposing first shield pattern 121 set to a ground electric potential in a region of second wiring layer 104 including intersection portion 100a in the plan view.

First shield pattern 121 is a solid pattern disposed in a region, which corresponds to intersection portion 100a, of second wiring layer 104 between first wiring layer 103 and third wiring layer 105. The region corresponding to intersection portion 100a is a region having a predetermined range that includes intersecting portions. It can also be said that the region corresponding to intersection portion 100a is a region having a predetermined range that includes intersection portion 100a in a plan view. A plan view shape of first shield pattern 121 is a rectangular shape, but the present disclosure is not limited to this example. It should be noted that first shield pattern 121 is not limited to being provided in second wiring layer 104, and may be provided in any of wiring layers between a wiring layer in which carrier-amplifier bias power supply wiring 31 or peak-amplifier bias power supply wiring 32 is provided and a wiring layer in which second radio-frequency signal wiring 2 is provided. In addition, the solid pattern includes a solid pattern that is partially slit.

Figure 1C:
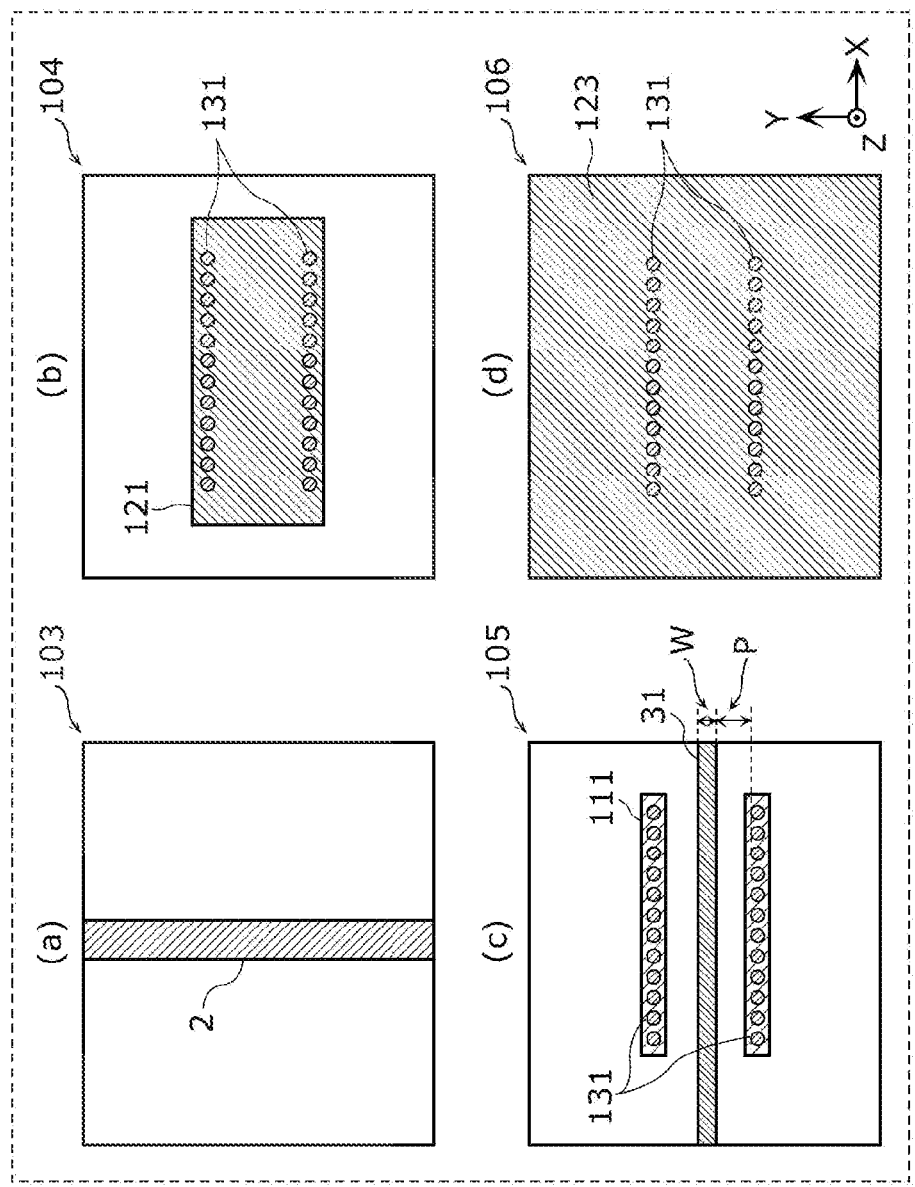
FIG. 1C shows an example of a plan view of each of wiring layers in an intersection portion of the radio-frequency power amplifier device according to Embodiment 1.

FIG. 1C shows an example of a plan view of each of wiring layers in intersection portion 100a of radio-frequency power amplifier device 200 according to Embodiment 1. (a) of FIG. 1C is a plan view of first wiring layer 103, (b) of FIG. 1C is a plan view of second wiring layer 104, (c) of FIG. 1C is a plan view of third wiring layer 105, and (d) of FIG. 1C is a plan view of fourth wiring layer 106. In (c) of FIG. 1C, W denotes the width (length in the Y-axis direction) of carrier-amplifier bias power supply wiring 31, and P denotes a space between one or more connection vias 131 and carrier-amplifier bias power supply wiring 31.

As shown in (b) of FIG. 1C, a plan view shape of first shield pattern 121 is, for example, a rectangular shape elongated in an extension direction (the X-axis direction) of carrier-amplifier bias power supply wiring 31. Moreover, first shield pattern 121 also serves as a radio-frequency-signal ground electric potential wire for second radio-frequency signal wiring 2.

When second radio-frequency signal wiring 2 is a microstrip line, immediately before second radio-frequency signal wiring 2 overlaps first shield pattern 121 in a plan view, ground electrode pattern 123 is a radio-frequency-signal ground electric potential wire, and first shield pattern 121 becomes a radio-frequency-signal ground electric potential wire in an overlapping portion. In order to make a characteristic impedance of the line of second radio-frequency signal wiring 2 the same value before and after the overlapping, it is necessary to decrease the width of second radio-frequency signal wiring 2 in the overlapping portion, and a transmission loss increases. Moreover, when the width of second radio-frequency signal wiring 2 remains the same before and after the overlapping, the characteristic impedance varies, so a reflection loss occurs. For this reason, it is desirable that the width (length in the Y-axis direction) of first shield pattern 121 be narrow as much as possible.

Here, with regard to space P, the following describes, as an example, intersignal interference (isolation) for a line space between two microstrip lines (e.g., quarter-wave lines having a characteristic impedance of 50Ω) having width W that are provided in the same wiring layer. A simulation of isolation for a line space between the two microstrip lines shows that isolation is −39 dB when the line space is three times as large as width W, and intersignal interference between the lines has no effect when the line space becomes more than three times as large as width W. In other words, intersignal interference measures should be taken for a range within a distance that is three times as large as width W. Likewise, in order to prevent noise of carrier-amplifier bias power supply wiring 31 from causing intersignal interference with other lines, intersignal interference measures should be taken for a range within a distance that is three times as large as width W of carrier-amplifier bias power supply wiring 31. To put it differently, space P should be made within a distance that is three times as large as width W of carrier-amplifier bias power supply wiring 31.

As shown in (c) of FIG. 1C, a plurality of ground electric potential connection vias 131 are spaced apart from each other in an extension direction of carrier-amplifier bias power supply wiring 31, on both sides of carrier-amplifier bias power supply wiring 31 within a distance that is three times as large as width W of carrier-amplifier bias power supply wiring 31 (P<3×W). As shown in (c) of FIG. 1C, carrier-amplifier bias power supply wiring 31 is located between the plurality of ground electric potential connection vias 131 in a plan view. It should be noted that a value of three times is an example and is determined appropriately.

The plurality of connection vias 131 are connected to first shield pattern 121 of second wiring layer 104 and ground electrode pattern 123 provided in fourth wiring layer 106. In other words, first shield pattern 121 is connected to ground electrode pattern 123 via the plurality of connection vias 131 and connection via pattern 111 provided in third wiring layer 105. Connection via pattern 111 is in a rectangular shape elongated in the extension direction of carrier-amplifier bias power supply wiring 31, to electrically connect the plurality of connection vias 131. Connection via 131 is also referred to as a ground connection via.

In such radio-frequency power amplifier device 200, as shown in FIG. 1B, carrier-amplifier bias power supply wiring 31 is surrounded by first shield pattern 121, the plurality of connection vias 131, and ground electrode pattern 123 in a cross-section view.

Although only carrier-amplifier bias power supply wiring 31 is indicated in the above configuration, a configuration in which two sets of bias power supply wiring, carrier-amplifier bias power supply wiring 31 and peak-amplifier bias power supply wiring 32, are surrounded by first shield pattern 121, the plurality of connection vias 131, and ground electrode pattern 123 is entirely acceptable. In addition, ground electric potential connection via 131 may be a through via or a filled via.

It is possible to take further interference prevention measures by surrounding, in a tunnel shape, carrier-amplifier bias power supply wiring 31 or peak-amplifier bias power supply wiring 32 that is signal wiring with which the interference is to be prevented. Such a configuration makes it possible to achieve the downsizing and adjustment-free function of a set board, adjust each of carrier amplifier semiconductor device 11 and peak amplifier semiconductor device 12 to an optimum bias point, and further reduce interference between a radio-frequency signal and a bias signal. Accordingly, radio-frequency power amplifier device 200 becomes capable of achieving low distortion characteristics due to a highly efficient operation and DPD.

It should be noted that FIG. 1C is a diagram illustrating an example of the shape of a ground electric potential connection via. The shape of ground electric potential connection via 131 is not limited to a circular shape in a plan view of radio-frequency power amplifier device 200, and may be an obround shape. For example, connection vias 131 in an obround shape may be spaced apart from each other along carrier-amplifier bias power supply wiring 31. Since it is possible to reduce a ratio of space between connection vias 131 by causing the plan view shape to be the obround shape, an interference prevention effect is further achieved.

Moreover, the carrier-amplifier bias power supply voltage or the peak-amplifier bias power supply voltage outputted from bias power supply semiconductor device 13 may be directly applied to carrier amplifier semiconductor device 11 or peak amplifier semiconductor device 12, respectively, or may be converted and then applied thereto.

Embodiment 2

Figure 2:
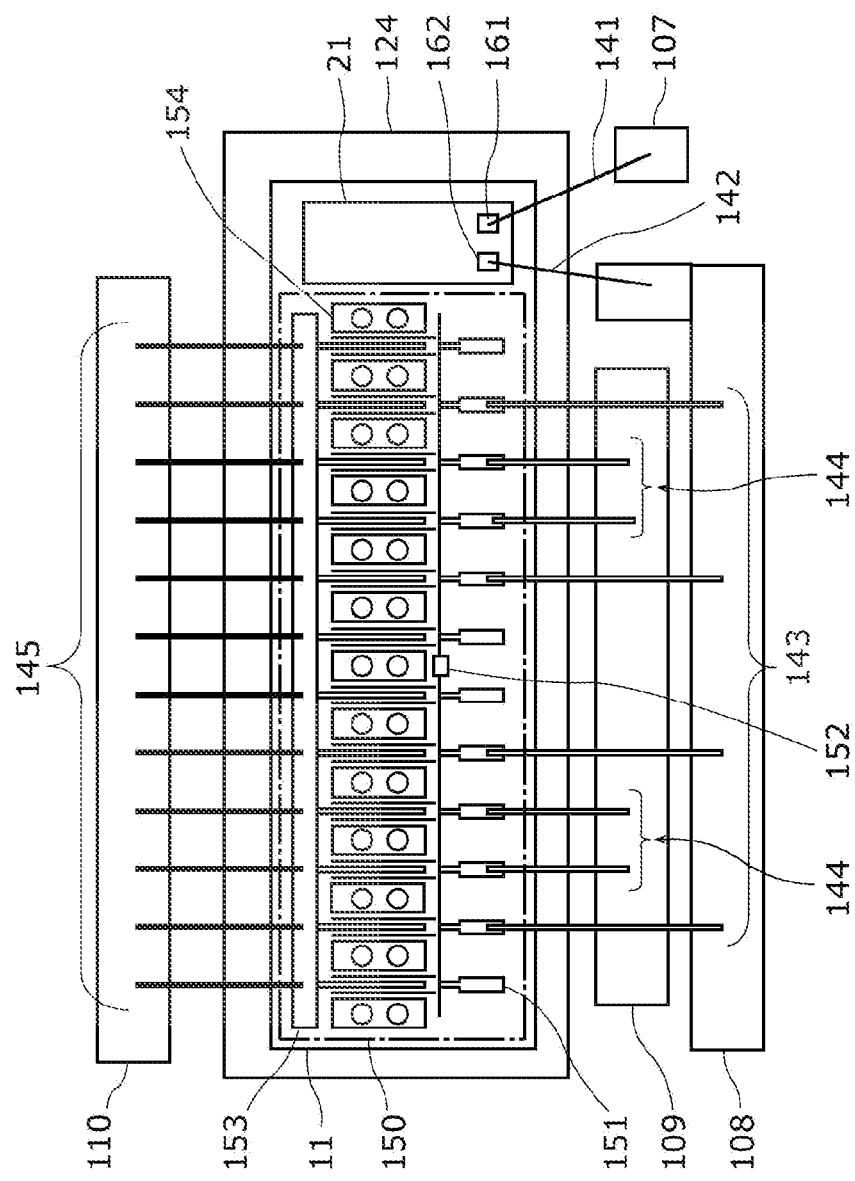
FIG. 2 is a diagram illustrating an example of a wire connection between a carrier amplifier semiconductor device and a multilayer submount substrate according to Embodiment 2.

FIG. 2 is a diagram illustrating an example of a wire connection between carrier amplifier semiconductor device 11 and multilayer submount substrate 100 according to Embodiment 2. In Embodiment 2, an example in which carrier amplifier semiconductor device 11 contains first gate bias circuit 21 will be described. First gate bias circuit 21 is an example of a bias circuit, is supplied with a bias power supply voltage from bias power supply semiconductor device 13, and supplies a bias voltage (gate bias voltage) to gate electrode 151.

Carrier amplifier semiconductor device 11 is disposed on die pad (die pad layer) 124 provided in first wiring layer 103 of multilayer submount substrate 100, and includes transistor 150 included in a carrier amplifier, and first gate bias circuit 21 that supplies a gate bias voltage to gate electrode 151 of transistor 150. A carrier-amplifier bias power supply voltage is supplied to input terminal 161 of first gate bias circuit 21, and a gate bias voltage is outputted from output terminal 162 of first gate bias circuit 21. Since a threshold voltage of transistor 150 varies for each of semiconductor chips, it is possible to perform bias control with higher accuracy by providing, in first gate bias circuit 21, a circuit that compensates a variation in threshold.

The carrier-amplifier bias power supply voltage outputted from bias power supply semiconductor device 13 is supplied from first wiring pattern 107 provided in first wiring layer 103 of multilayer submount substrate 100 to input terminal 161 of first gate bias circuit 21 via first connecting wire 141. Though not shown in FIG. 2, first wiring pattern 107 is electrically connected to carrier-amplifier bias power supply wiring 31. A gate bias voltage is outputted from output terminal 162 of first gate bias circuit 21 to second wiring pattern 108 via second connecting wire 142. The gate bias voltage is supplied from second wiring pattern 108 to gate electrode 151 of transistor 150 included in the carrier amplifier via a plurality of third connecting wires 143 (four in FIG. 2). Second connecting wire 142 connects second wiring pattern 108 of first wiring layer 103 and output terminal 162 of first gate bias circuit 21. Third connecting wire 143 connects second wiring pattern 108 and a gate terminal connected to gate electrode 151.

An increase in output voltage requires an increase in transistor size (Wg) of a power amplifier. An increase in transistor size results in an increase in the number of gate fingers, and there is a possibility that amplifying a radio-frequency signal in this state causes loop oscillation. For this reason, generally, loop oscillation measures are taken by inserting resistor 152 of approximately 2Ω to 5Ω between gate electrodes connected in parallel when the transistor size is increased. Since resistor 152 is connected between the gate electrodes, supplying a gate bias voltage from first gate bias circuit 21 directly to closest gate electrode 151 causes an electric potential difference in the gate bias voltage supplied to gate electrode 151 due to a voltage drop by resistor 152. This electric potential difference can contribute to the uneven operation of transistor 150. Accordingly, the gate bias voltage is supplied from first gate bias circuit 21 to gate electrode 151 of transistor 150 included in the carrier amplifier once via a wiring pattern (e.g., second wiring pattern 108) provided in first wiring layer 103 of multilayer submount substrate 100.

Moreover, an input signal to carrier amplifier semiconductor device 11 that amplifies the first radio-frequency signal is connected from third wiring pattern 109 to gate electrode 151 of transistor 150 included in the carrier amplifier via a plurality of fourth connecting wires 144 (four in FIG. 2). The input signal is inputted via a path different from the path of the gate bias voltage.

The configuration shown in FIG. 2 makes it possible to reduce the interference between the radio-frequency signal and the bias signal (gate bias voltage), which enables achieving the low distortion characteristics due to the highly efficient operation and the DPD.

It should be noted that although Embodiment 2 has described the example in which first gate bias circuit 21 is provided in carrier amplifier semiconductor device 11, a gate bias circuit may be provided in peak amplifier semiconductor device 12. In this case, a second radio-frequency signal and a gate bias voltage may be inputted to the gate electrode of a transistor included in a peak amplifier via a different path. In addition, a peak-amplifier bias power supply voltage is supplied to an input terminal of the gate bias circuit of peak amplifier semiconductor device 12 via a wiring pattern electrically connected to peak-amplifier bias power supply wiring 32.

Moreover, though not shown in FIG. 2, when carrier amplifier semiconductor device 11 further contains a capacitor for matching, second wiring pattern 108 may be connected to a terminal of the capacitor with a connecting wire. Since the connecting wire can be viewed as an inductor component in a radio-frequency wave, a matching circuit including the inductor component obtained by combining the connecting wire to the terminal of the capacitor and third connecting wire 143 can be configured.

Furthermore, as shown in FIG. 2, drain electrode 153 of transistor 150 is connected to fourth wiring pattern 110 via fifth connecting wires 145. Additionally, although source electrode 154 of transistor 150 is disposed between gate electrode 151 and drain electrode 153 in a plan view, the present disclosure is not limited to this example.

Embodiment 3

Figure 3:
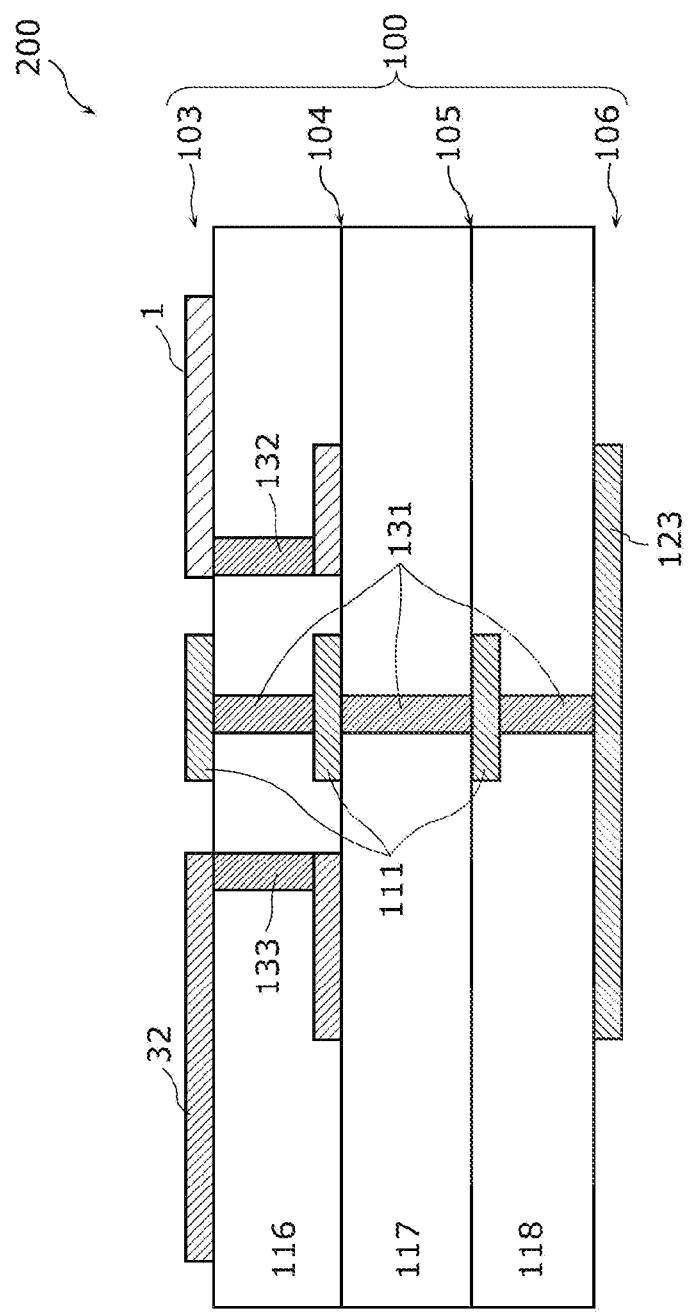
FIG. 3 shows an example of a cross sectional structural view for illustrating signal interference measures by an arrangement of vias in resin layers of a multilayer submount substrate according to Embodiment 3.

FIG. 3 shows an example of a cross sectional structural view for illustrating signal interference measures by an arrangement of vias in resin layers of multilayer submount substrate 100 according to Embodiment 3. FIG. 3 is a cross-sectional view of a region of multilayer submount substrate 100 other than intersection portion 100a of radio-frequency signal wiring and bias power supply wiring. It should be noted that the following mainly describes differences from Embodiment 1, and the description of the same or similar content as Embodiment 1 will be omitted or simplified. The region other than intersection portion 100a is, for example, a region in which first shield pattern 121 is not provided in a plan view.

As shown in FIG. 3, in first resin layer 116 that is a single resin layer, ground electric potential connection via pattern 111 and connection via 131 that is set to a ground electric potential are disposed between (i) radio-frequency signal connection via 132 connected to first radio-frequency signal wiring 1 that transmits the first radio-frequency signal to carrier amplifier semiconductor device 11 and (ii) bias power supply connection via 133 connected to peak-amplifier bias power supply wiring 32 that supplies a peak-amplifier bias power supply voltage. Connection via pattern 111 and connection via 131 are connected to ground electrode pattern 123. Bias power supply connection via 133 is supplied with the peak-amplifier bias power supply voltage.

By disposing connection via 131, which is the ground electric potential, between radio-frequency signal connection via 132 and bias power supply connection via 133 that are provided in the same resin layer of multilayer submount substrate 100, it is possible to prevent signal interference between the connection vias provided in the same resin layer.

It should be noted that Embodiment 3 has described the example in which bias power supply connection via 133 is connected to peak-amplifier bias power supply wiring 32, bias power supply connection via 133 may be connected to carrier-amplifier bias power supply wiring 31. In addition, connection via 131, which is the ground electric potential, may be located between radio-frequency signal connection vias or bias power supply voltage connection vias that are provided in the same resin layer.

Moreover, when a plurality of bias power supply connection vias 133 are connected to peak-amplifier bias power supply wiring 32 or carrier-amplifier bias power supply wiring 31, in a plan view, a plurality of ground electric potential connection vias 131 may be spaced apart from each other in an arrangement direction of the plurality of bias power supply connection vias 133, within a distance that is three times as large as width W (see FIG. 1C) of peak-amplifier bias power supply wiring 32 or carrier-amplifier bias power supply wiring 31 along a row of the plurality of bias power supply connection vias 133.

Accordingly, since the plurality of connection vias 131 are disposed in the arrangement direction of the plurality of bias power supply connection vias 133, it is possible to further prevent the signal interference between the connection vias provided in the same resin layer.

Furthermore, in multilayer submount substrate 100, types of the ground electric potential may include a radio-frequency-signal ground electric potential that is a reference electric potential of the first and second radio-frequency signals, and a bias-power-supply ground electric potential that is a reference electric potential of the carrier-amplifier bias power supply voltage and the peak-amplifier bias power supply voltage. An electric potential of a ground electric potential connection via may be the bias-power-supply ground electric potential. The radio-frequency-signal ground electric potential and the bias-power-supply ground electric potential each are connected to a ground (ground electric potential) of a different system. The radio-frequency-signal ground electric potential and the bias-power-supply ground electric potential may be connected to a common ground outside radio-frequency power amplifier device 200. In other words, the radio-frequency-signal ground electric potential and the bias-power-supply ground electric potential may be each connected to a different ground in radio-frequency power amplifier device 200. It should be noted that the radio-frequency-signal ground electric potential and the bias-power-supply ground electric potential may be connected to a common ground (e.g., ground electrode pattern 123) in radio-frequency power amplifier device 200.

Figure 4:
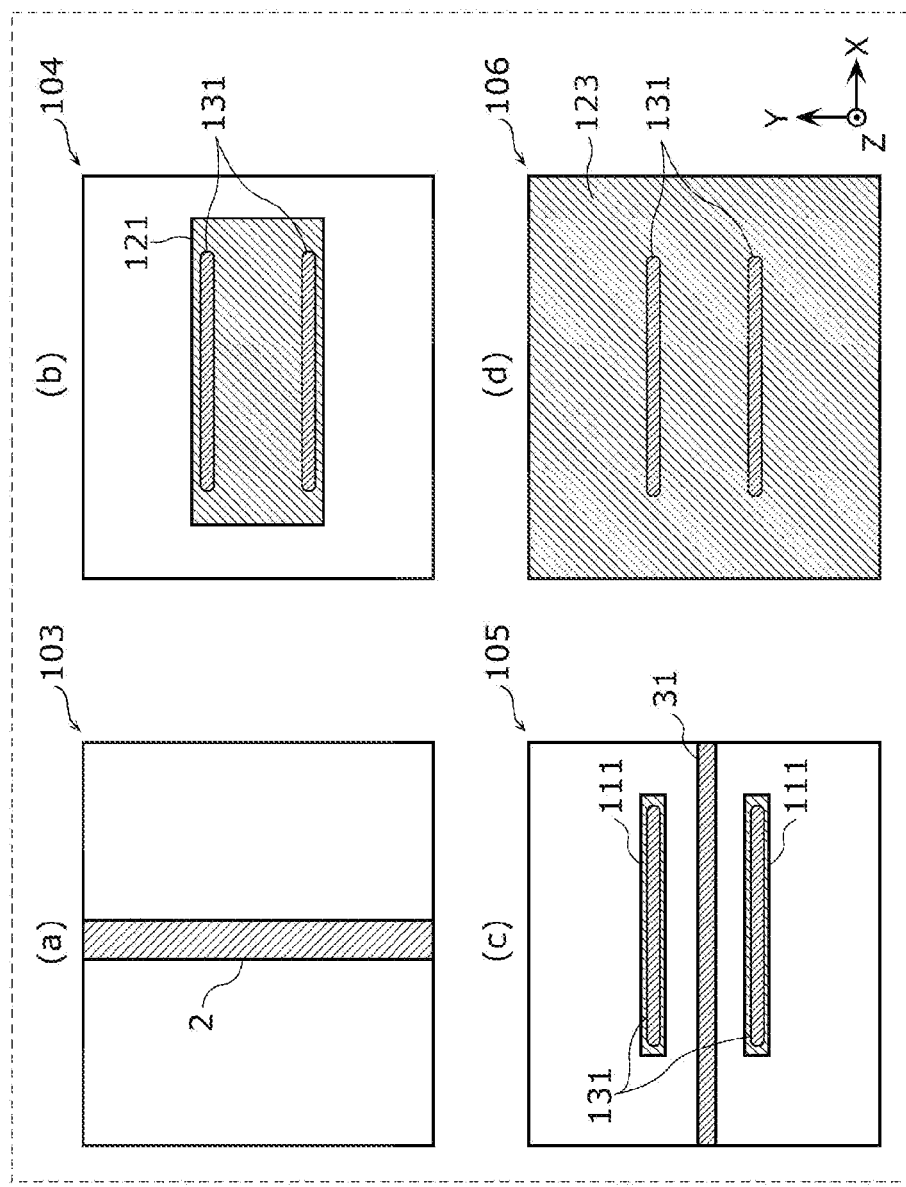
FIG. 4 shows an example of a plan view of each of wiring layers in an intersection portion of a radio-frequency power amplifier device according to Embodiment 3.

Here, another example of the shape of a connection via will be described with reference to FIG. 4. FIG. 4 shows an example of a plan view of each of wiring layers in intersection portion 100a of radio-frequency power amplifier device 200 according to Embodiment 3. FIG. 4 is a diagram illustrating another example of the shape of a ground electric potential connection via.

As shown in FIG. 4, the shape of ground electric potential connection via 131 may be an obround shape in a plan view of radio-frequency power amplifier device 200. In a plan view, carrier-amplifier bias power supply wiring 31 is located between a pair of connection vias 131 in the obround shape. It can also be said that radio-frequency power amplifier device 200 includes, in third wiring layer 105, one connection via 131 disposed on each of both sides of the width of carrier-amplifier bias power supply wiring 31 in an extension direction of carrier-amplifier bias power supply wiring 31. Since no space is formed between the connection vias by causing the shape to be the obround shape, the interference prevention effect is further achieved. The longer axis of the obround shape is parallel to, for example, the extension direction of carrier-amplifier bias power supply wiring 31.

Embodiment 4

Figure 5:
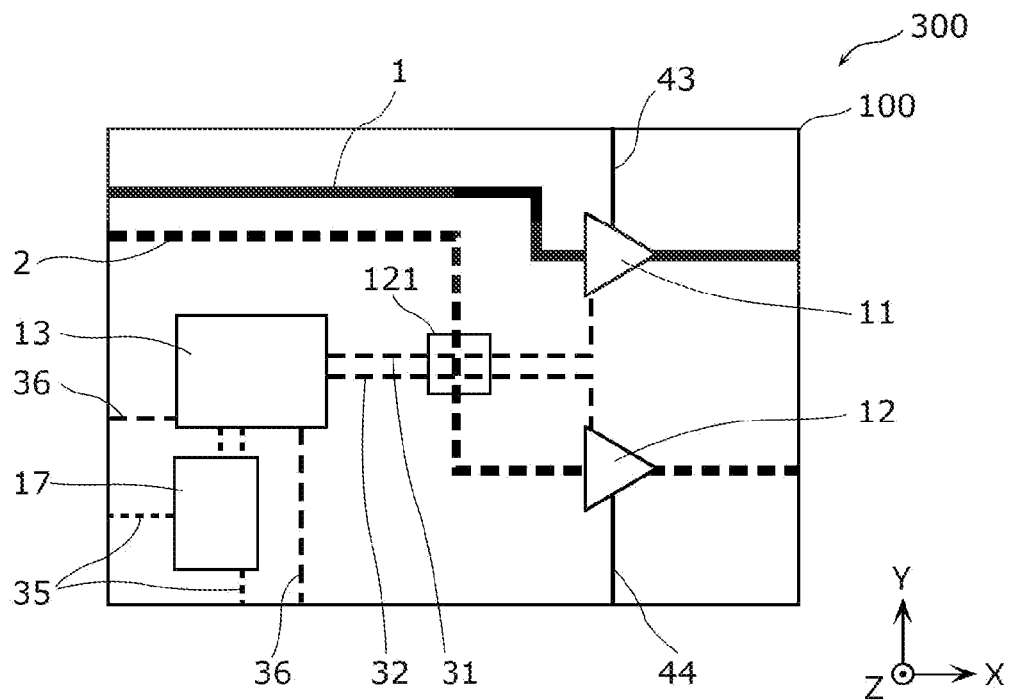
FIG. 5 shows an example of a plan view of a radio-frequency power amplifier device in which a microcontroller unit semiconductor device is mounted on a multilayer submount substrate according to Embodiment 4.

FIG. 5 shows an example of a plan view of radio-frequency power amplifier device 300 in which microcontroller unit semiconductor device 17 is mounted on multilayer submount substrate 100 according to Embodiment 4. Radio-frequency power amplifier device 300 according to Embodiment 4 differs from radio-frequency power amplifier device 200 according to Embodiment 1 in microcontroller unit semiconductor device 17 mounted therein.

By mounting microcontroller unit semiconductor device 17 on multilayer submount substrate 100, it is possible to control a carrier-amplifier bias power supply voltage and a peak-amplifier bias power supply voltage with higher accuracy even when an environment changes. For example, by storing a parameter for temperature change into microcontroller unit semiconductor device 17 in advance, it is possible to vary a bias voltage in response to the temperature change, based on the parameter.

Microcontroller unit semiconductor device 17 is a semiconductor chip or a package product that controls each of semiconductor devices on multilayer submount substrate 100. Microcontroller unit semiconductor device 17 controls the operation of bias power supply semiconductor device 13 in accordance with the temperature of radio-frequency power amplifier device 300 (e.g., the ambient temperature of radio-frequency power amplifier device 300). Microcontroller unit semiconductor device 17 outputs, for example, a correction value corresponding to a temperature to bias power supply semiconductor device 13. The correction value may be a value for correcting a bias power supply voltage outputted by bias power supply semiconductor device 13.

Microcontroller unit semiconductor device 17 causes bias power supply semiconductor device 13 to, for example, keep an idle current of a transistor (e.g., transistor 150) constant by adjusting a bias voltage applied to the gate electrode of the transistor to reduce a variation in idle current due to temperature change. It should be noted that although a temperature is obtained by, for example, a sensor disposed on a set board on which radio-frequency power amplifier device 300 is mounted, the present disclosure is not limited to this example.

Microcontroller unit semiconductor device 17 is connected to digital signal wiring 35 that inputs and outputs digital signals. There is a possibility that digital signal noise occurring when digital signals are propagated affects the first and second radio-frequency signals to degrade the properties of radio-frequency power amplifier device 300, the digital signals being inputted and outputted between microcontroller unit semiconductor device 17 and an external device of radio-frequency power amplifier device 300 and between microcontroller unit semiconductor device 17 and bias power supply semiconductor device 13.

Accordingly, by disposing at least one of carrier-amplifier bias power supply wiring 31, peak-amplifier bias power supply wiring 32, analog power supply wiring 36 connected to bias power supply semiconductor device 13, or a ground electric potential wire (not shown) between (i) digital signal wiring 35 that propagates digital signals and (ii) first radio-frequency signal wiring 1 and second radio-frequency signal wiring 2 that transmit the first and second radio-frequency signals of carrier amplifier semiconductor device 11 and peak amplifier semiconductor device 12, the digital signal noise is absorbed, which makes it possible to reduce interference from the digital signal noise. The ground electric potential wire is a reference electric potential wire (ground wire) for bias power supply wiring, radio-frequency signal wiring, etc. For example, a plurality of ground electric potential wires are disposed.

As a result, at least one of carrier-amplifier bias power supply wiring 31, peak-amplifier bias power supply wiring 32, analog power supply wiring 36 or the ground electric potential wire serves as a shield, which makes it possible to prevent the noise of digital signal wiring 35 from affecting the first and second radio-frequency signals.

It should be noted that disposing an other wire between digital signal wiring 35 and first radio-frequency signal wiring 1 and second radio-frequency signal wiring 2 means disposing an other wire to cause a virtual line (straight line) connecting any point of digital signal wiring 35 and any other points of first radio-frequency signal wiring 1 and second radio-frequency signal wiring 2 to interest the other wire.

It should be noted that disposing a plurality of ground electric potential wires between digital signal wiring 35 and first radio-frequency signal wiring 1 and second radio-frequency signal wiring 2 makes it possible to further prevent the interference. Moreover, in multilayer submount substrate 100, types of the plurality of ground electric potential wires include a radio-frequency-signal ground electric potential wire that is a reference electric potential of the first radio-frequency signal and the second radio-frequency signal, and a digital-signal ground electric potential wire that is a reference potential of a digital signal. The plurality of ground electric potential wires may be mutually different types of ground electric potential wires. For example, the plurality of ground electric potential wires may include a radio-frequency-signal ground electric potential wire and a digital-signal ground electric potential wire, and the radio-frequency-signal ground electric potential wire and the digital-signal ground electric potential wire may be mutually different types (systems) of ground electric potential wires. This makes it possible to effectively prevent the noise of digital signal wiring 35 from affecting the first and second radio-frequency signals, compared to a case in which the radio-frequency-signal ground electric potential wire and the digital-signal ground electric potential wire are the same type of ground electric potential wires.

Furthermore, the digital-signal ground electric potential wire may be disposed closer to the digital signal wiring than to the radio-frequency signal wiring, and the radio-frequency-signal ground electric potential wire may be disposed closer to the radio-frequency signal wiring than to the digital signal wiring. This makes it possible to effectively prevent the noise of digital signal wiring 35 from affecting the first and second radio-frequency signals.

Moreover, in a plan view of multilayer submount substrate 100, a region including digital signal wiring 35 may be distinguished from a region including the radio-frequency signal wiring by the digital-signal ground electric potential wire. Accordingly, since the digital-signal ground electric potential wire serves as a shield, it is possible to effectively prevent the noise of digital signal wiring 35 from affecting the first and second radio-frequency signals. It should be noted that the term "distinguished" means that digital signal wiring 35 is disposed only in one region distinguished by the digital-signal ground electric potential wire in a plan view, and the radio-frequency signal wiring is disposed only in an other region distinguished by the digital-signal ground electric potential wire.

It should be noted that in the case shown in FIG. 5, each of carrier-amplifier bias power supply wiring 31 and peak-amplifier bias power supply wiring 32 intersects second radio-frequency signal wiring 2 in a plan view. In this case, first shield pattern 121 is provided over carrier-amplifier bias power supply wiring 31 and peak-amplifier bias power supply wiring 32 in the plan view. In a cross-sectional view, carrier-amplifier bias power supply wiring 31 and peak-amplifier bias power supply wiring 32 may be surrounded collectively or individually by first shield pattern 121, the plurality of connection vias 131, and ground electrode pattern 123.

Embodiment 5

Figure 6:
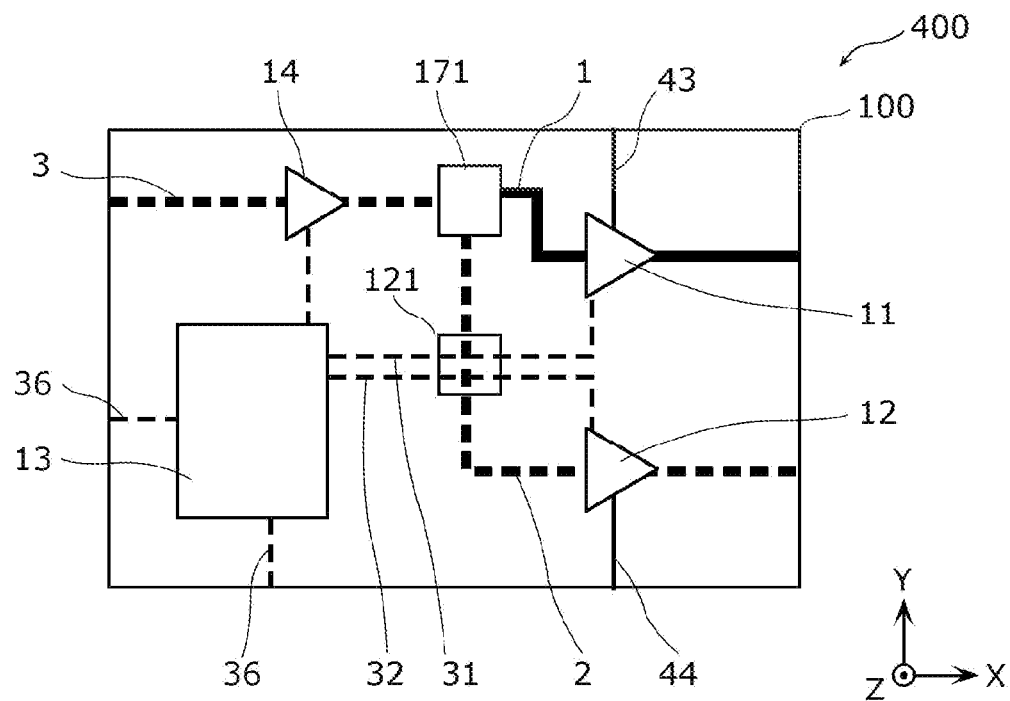
FIG. 6 shows an example of a plan view of a radio-frequency power amplifier device according to Embodiment 5.

FIG. 6 shows an example of a plan view of radio-frequency power amplifier device 400 according to Embodiment 5.

As shown in FIG. 6, driver amplifier semiconductor device 14 that amplifies a third radio-frequency signal and divider 171 that divides the third radio-frequency signal amplified by driver amplifier semiconductor device 14 into a first radio-frequency signal and a second radio-frequency signal are mounted on multilayer submount substrate 100. The other constituent elements are the same as those of radio-frequency power amplifier device 200 according to Embodiment 1, and thus the description thereof will be omitted.

Driver amplifier semiconductor device 14 is a semiconductor chip that includes a driver amplifier that drives a carrier amplifier and a peak amplifier, and is a pre-amplifier for carrier amplifier semiconductor device 11 and peak amplifier semiconductor device 12. Driver amplifier semiconductor device 14 is disposed closer to a radio-frequency-signal input side than carrier amplifier semiconductor device 11 and peak amplifier semiconductor device 12. Driver amplifier semiconductor device 14 amplifies the third radio-frequency signal transmitted via third radio-frequency signal wiring 3.

Bias power supply semiconductor device 13 is configured to output a bias power supply voltage for driver to driver amplifier semiconductor device 14 in addition to a carrier-amplifier bias power supply voltage and a peak-amplifier bias power supply voltage, and to control these bias power supply voltages independently of each other. The bias power supply voltage for driver is an example of a bias power supply voltage.

Divider 171 is implemented by, for example, a Wilkinson coupler, but the present disclosure is not limited to this example.

Mounting driver amplifier semiconductor device 14 in radio-frequency power amplifier device 400 eliminates the need to mount a driver amplifier on a set board, which makes it possible to contribute to the downsizing of the set board.

Embodiment 6

Figure 7:
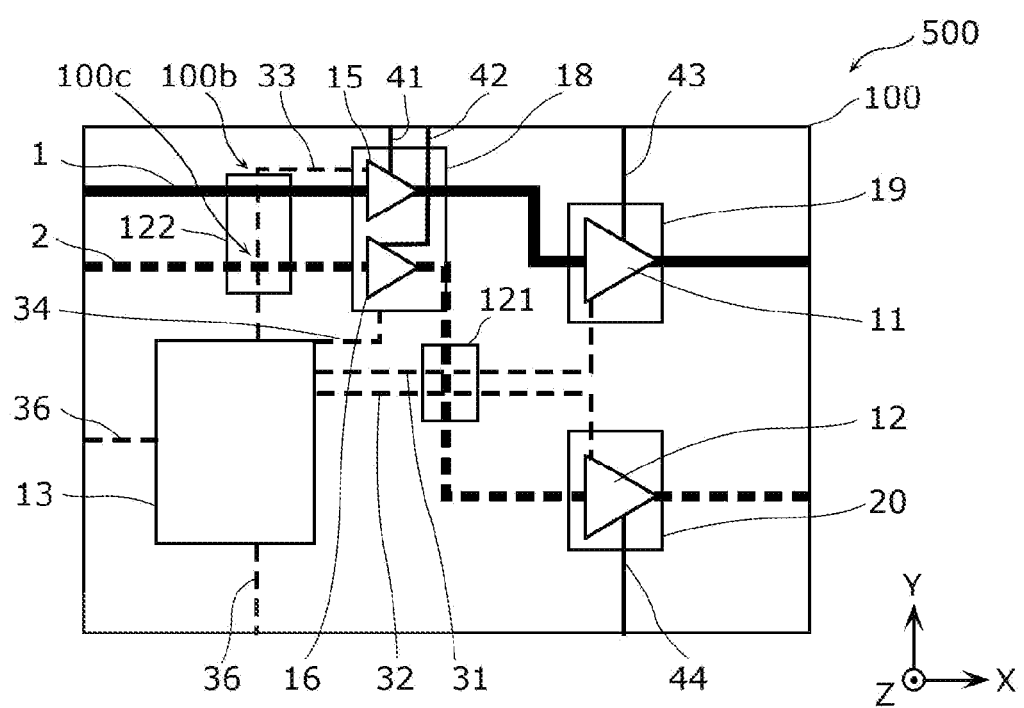
FIG. 7 shows an example of a plan view of a radio-frequency power amplifier device according to Embodiment 6.

FIG. 7 shows an example of a plan view of radio-frequency power amplifier device 500 according to Embodiment 6. A driver amplifier semiconductor device is first monolithic semiconductor device 18 that includes carrier driver amplifier semiconductor device 15 that is a pre-amplifier for carrier amplifier semiconductor device 11, and peak driver amplifier semiconductor device 16 that is a pre-amplifier for peak amplifier semiconductor device 12. Carrier amplifier semiconductor device 11 and peak amplifier semiconductor device 12 are second monolithic semiconductor device 19 and third monolithic semiconductor device 20, respectively. It should be noted that a monolithic semiconductor device means a single-chip semiconductor device.

Carrier driver amplifier semiconductor device 15 is a semiconductor chip that includes a driver amplifier that drives a carrier amplifier. Carrier driver amplifier semiconductor device 15 is supplied with a power supply voltage via carrier driver amplifier power supply wiring 41.

Peak driver amplifier semiconductor device 16 is a semiconductor chip that includes a driver amplifier that drives a peak amplifier. Peak driver amplifier semiconductor device 16 is supplied with a power supply voltage via peak driver amplifier power supply wiring 42.

At least one of carrier driver amplifier semiconductor device 15 or peak driver amplifier semiconductor device 16 may contain a capacitor for matching.

First radio-frequency signal wiring 1 connected to carrier driver amplifier semiconductor device 15 or second radio-frequency signal wiring 2 connected to peak driver amplifier semiconductor device 16 is provided in first wiring layer 103 of multilayer submount substrate 100. Carrier-driver-amplifier bias power supply wiring 33 supplied with a carrier-driver-amplifier bias power supply voltage outputted from bias power supply semiconductor device 13 or peak-driver-amplifier bias power supply wiring 34 supplied with a peak-driver-amplifier bias power supply voltage outputted from bias power supply semiconductor device 13 is provided in third wiring layer 105. At least one of first radio-frequency signal wiring 1 or second radio-frequency signal wiring 2 intersects at least one of carrier-driver-amplifier bias power supply wiring 33 or peak-driver-amplifier bias power supply wiring 34 in a plan view. For example, the intersection portions are orthogonal in the plan view. In Embodiment 6, first radio-frequency signal wiring 1 and second radio-frequency signal wiring 2 are orthogonal to carrier-driver-amplifier bias power supply wiring 33 at intersection portions 100b and 100c, respectively.

Second shield pattern 122 set to a ground electric potential is disposed in second wiring layer 104 of intersection portions 100b and 100c. A plurality of ground electric potential connection vias 131 are spaced apart from each other in an extension direction (the Y-axis direction in the example shown in FIG. 7) of carrier-driver-amplifier bias power supply wiring 33 or peak-driver-amplifier bias power supply wiring 34, on both sides along carrier-driver-amplifier bias power supply wiring 33 or peak-driver-amplifier bias power supply wiring 34 within a distance that is three times as large as the width of carrier-driver-amplifier bias power supply wiring 33 or peak-driver-amplifier bias power supply wiring 34. The plurality of connection vias 131 are connected to second shield pattern 122 of second wiring layer 104 and ground electrode pattern 123 of fourth wiring layer 106.

Second shield pattern 122 is provided, for example, in a rectangular shape to cover intersection portions 100b and 100c in a plan view. In addition, second shield pattern 122 is provided over, for example, first radio-frequency signal wiring 1 and second radio-frequency signal wiring 2 in the plan view.

Embodiment 7

Figure 8:
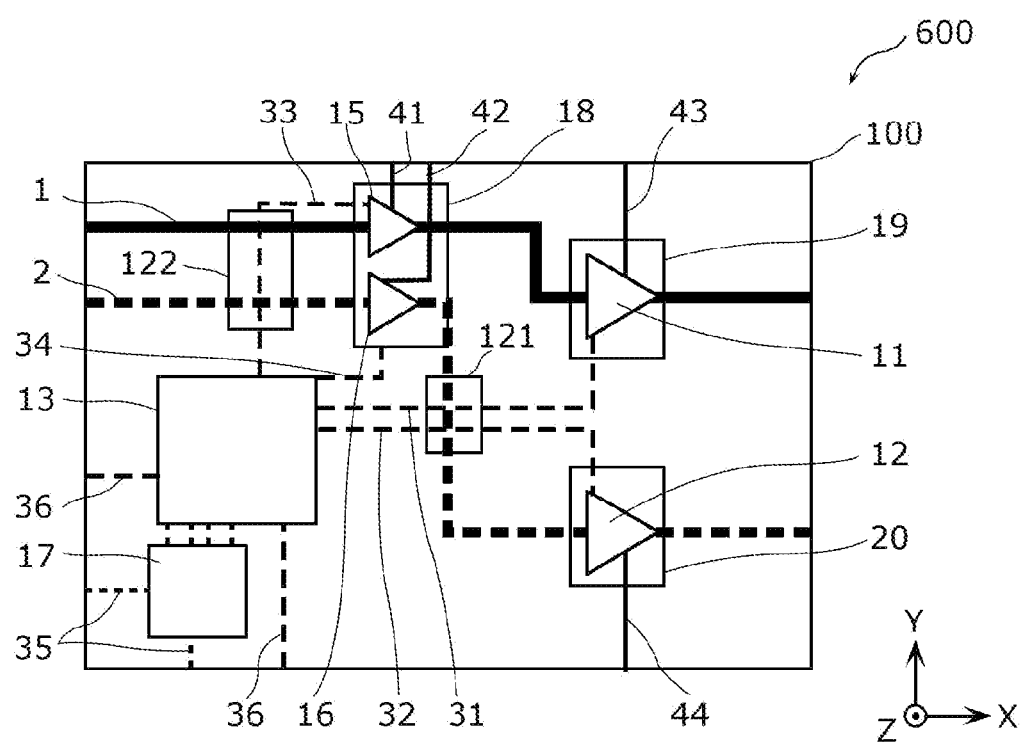
FIG. 8 shows an example of a plan view of a radio-frequency power amplifier device according to Embodiment 7.

FIG. 8 shows an example of a plan view of radio-frequency power amplifier device 600 according to Embodiment 7.

Radio-frequency power amplifier device 600 includes microcontroller unit semiconductor device 17 on first principal surface 101 of multilayer submount substrate 100. An arrangement space between microcontroller unit semiconductor device 17 and carrier amplifier semiconductor device 11 is wider than an arrangement space between microcontroller unit semiconductor device 17 and peak amplifier semiconductor device 12. It can also be said that carrier amplifier semiconductor device 11 is located at a greater distance from microcontroller unit semiconductor device 17 than peak amplifier semiconductor device 12 is in a plan view. Carrier amplifier semiconductor device 11 and microcontroller unit semiconductor device 17 are disposed, for example, on a diagonal line of multilayer submount substrate 100 in the plan view. Microcontroller unit semiconductor device 17 and peak amplifier semiconductor device 12 are disposed, for example, close to a side of multilayer submount substrate 100 on the same side (in the example shown in FIG. 8, a side of multilayer submount substrate 100 on a Y-axis minus side out of a Y-axis plus side and the Y-axis minus side) in the plan view.

Peak amplifier semiconductor device 12 operates only when a power range of radio-frequency power amplifier device 600 is high, whereas carrier amplifier semiconductor device 11 operates in the entirety of the output range. For this reason, further increasing the space between carrier amplifier semiconductor device 11 and microcontroller unit semiconductor device 17 makes it possible to reduce the effect of digital signal noise.

Embodiment 8

Figure 9A:
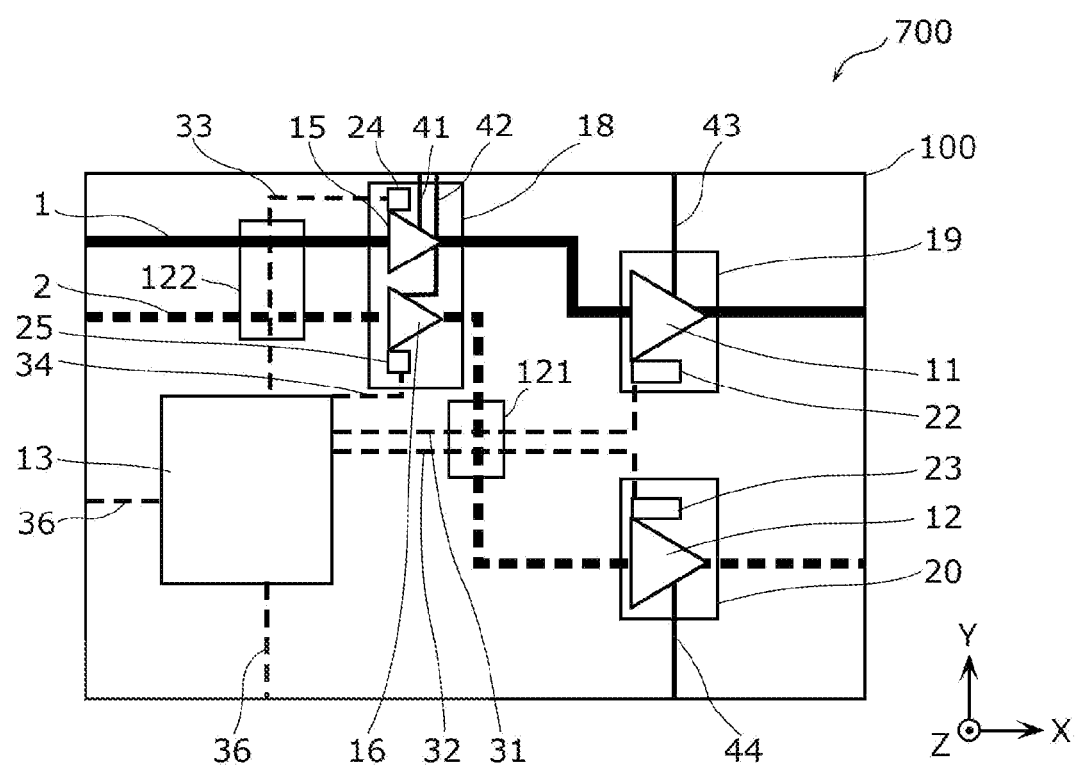
FIG. 9A shows an example of a plan view of a radio-frequency power amplifier device according to Embodiment 8 when a bias circuit is disposed in each of amplifiers of the radio-frequency power amplifier device.

FIG. 9A shows an example of a plan view of radio-frequency power amplifier device 700 according to Embodiment 8 when a bias circuit is disposed in each of amplifiers of radio-frequency power amplifier device 700.

As shown in FIG. 9A, carrier amplifier semiconductor device 11 and peak amplifier semiconductor device 12 include carrier amplifier bias circuit 22 and peak amplifier bias circuit 23, respectively, each of which supplies a bias voltage to the gate electrode of a transistor included in an amplifier. Carrier amplifier semiconductor device 11 contains carrier amplifier bias circuit 22, and peak amplifier semiconductor device 12 contains peak amplifier bias circuit 23. At least one of carrier driver amplifier semiconductor device 11 or peak driver amplifier semiconductor device 12 may contain a capacitor for matching.

Carrier amplifier bias circuit 22 is supplied with a carrier-amplifier bias power supply voltage from bias power supply semiconductor device 13, and outputs a bias voltage to the gate electrode of a carrier amplifier. Peak amplifier bias circuit 23 is supplied with a peak-amplifier bias power supply voltage from bias power supply semiconductor device 13, and outputs a bias voltage to the gate electrode of a peak amplifier.

Carrier amplifier bias circuit 22 is disposed close to an outer perimeter side of carrier amplifier semiconductor device 11 that faces and is close to (e.g., faces and is closest to) an outer perimeter side of peak amplifier semiconductor device 12 when carrier amplifier semiconductor device 11 and peak amplifier semiconductor device 12 are disposed on multilayer submount substrate 100. Peak amplifier bias circuit 23 is disposed close to an outer perimeter of peak amplifier semiconductor device 12 that faces and is close to an outer perimeter side of carrier amplifier semiconductor device 11 when carrier amplifier semiconductor device 11 and peak amplifier semiconductor device 12 are disposed on multilayer submount substrate 100. In the example shown in FIG. 9A, carrier amplifier bias circuit 22 is disposed on a peak amplifier semiconductor device 12 side (close to a side on the Y-axis minus side) of second monolithic semiconductor device 19 in a plan view, and peak amplifier bias circuit 23 is disposed on a carrier amplifier semiconductor device 11 side (close to a side on the Y-axis plus side) of third monolithic semiconductor device 20 in the plan view.

For example, causing carrier amplifier bias circuit 22 and peak amplifier bias circuit 23 to face and be closest to each other makes it easy to lay out carrier-amplifier bias power supply wiring 31 and peak-amplifier bias power supply wiring 32, and further makes it easy to lay out first shield pattern 121 and ground electric potential connection vias 131 for use in the prevention of interference.

Moreover, carrier driver amplifier semiconductor device 15 and peak driver amplifier semiconductor device 16 include carrier driver amplifier bias circuit 24 and peak driver amplifier bias circuit 25, respectively. Carrier driver amplifier semiconductor device 15 contains carrier driver amplifier bias circuit 24, and peak driver amplifier semiconductor device 16 contains peak driver amplifier bias circuit 25. At least one of carrier driver amplifier semiconductor device 15 or peak driver amplifier semiconductor device 16 may contain a capacitor for matching.

Carrier driver amplifier bias circuit 24 is supplied with a carrier-amplifier bias power supply voltage from bias power supply semiconductor device 13, and outputs a bias voltage to the gate electrode of a carrier driver amplifier. Peak driver amplifier bias circuit 25 is supplied with a peak-amplifier bias power supply voltage from bias power supply semiconductor device 13, and outputs a bias voltage to the gate electrode of a peak driver amplifier.

Carrier driver amplifier bias circuit 24 is disposed close to an outer perimeter side of carrier driver amplifier semiconductor device 15 that is located remotely from (e.g., located most remotely from) an outer perimeter side of peak driver amplifier semiconductor device 16 when carrier driver amplifier semiconductor device 15 and peak driver amplifier semiconductor device 16 are disposed on multilayer submount substrate 100. Peak driver amplifier bias circuit 25 is disposed close to an outer perimeter side of peak driver amplifier semiconductor device 16 that is located remotely from an outer perimeter side of carrier driver amplifier semiconductor device 15 when carrier driver amplifier semiconductor device 15 and peak driver amplifier semiconductor device 16 are disposed on multilayer submount substrate 100. In the example shown in FIG. 9A, carrier driver amplifier bias circuit 24 is disposed on an opposite side (the Y-axis plus side) of peak driver amplifier semiconductor device 16 of first monolithic semiconductor device 18 in a plan view, and peak driver amplifier bias circuit 25 is disposed on an opposite side (the Y-axis minus side) of carrier driver amplifier semiconductor device 15 of first monolithic semiconductor device 18 in the plan view.

Since the driver amplifiers are reduced in transistor size, causing carrier driver amplifier bias circuit 24 and peak driver amplifier bias circuit 25 to be located most remotely from each other makes it easy to lay out the matching circuits of carrier driver amplifier semiconductor device 15 and peak driver amplifier semiconductor device 16.

Figure 9B:
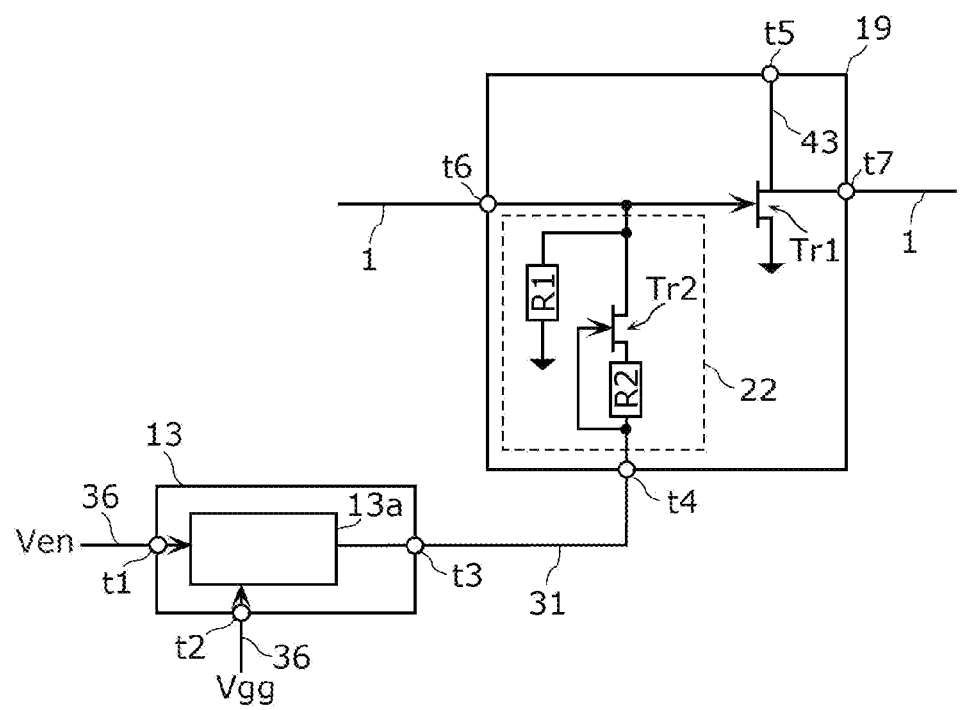
FIG. 9B shows an example of a circuit diagram illustrating a bias power supply semiconductor device and a bias circuit according to Embodiment 8.

Here, a circuit configuration of bias power supply semiconductor device 13 and a bias circuit will be described with reference to FIG. 9B. FIG. 9B shows an example of a circuit diagram illustrating bias power supply semiconductor device 13 and a bias circuit according to Embodiment 8. Carrier amplifier bias circuit 22, peak amplifier bias circuit 23, carrier driver amplifier bias circuit 24, and peak driver amplifier bias circuit 25 may have the same circuit configuration. Carrier amplifier bias circuit 22 will be described with reference to FIG. 9B.

Carrier amplifier semiconductor device 11 is configured to include second transistor Tr2. Bias power supply semiconductor device 13 is configured to be capable of controlling carrier amplifier bias circuit 22, peak amplifier bias circuit 23, carrier driver amplifier bias circuit 24, and peak driver amplifier bias circuit 25 individually.

As shown in FIG. 9B, bias power supply semiconductor device 13 and second monolithic semiconductor device 19 are provided on multilayer submount substrate 100. Bias power supply semiconductor device 13 is provided in a region external to second monolithic semiconductor device 19 on multilayer submount substrate 100.

Bias power supply semiconductor device 13 according to Embodiment 8 is a control device (enable control circuit) that controls the active state of a bias voltage applied to the gate of first transistor Tr1. Bias power supply semiconductor device 13 is configured to include, for example, switch element 13a that selectively outputs a voltage lower than a threshold voltage of first transistor Tr1 and a voltage higher than the threshold voltage via terminal t3 in response to a change in voltage Ven (High voltage/Low voltage) applied to terminal t1. Switch element 13a is configured to include a plurality of transistors.

Moreover, terminals t1 and t2 that are input terminals of bias power supply semiconductor device 13 and terminal t3 that is an output terminal of bias power supply semiconductor device 13 are provided on multilayer submount substrate 100. Terminal t1 is supplied with voltage Ven via analog power supply wiring 36, and terminal t2 is supplied with voltage Vgg via analog power supply wiring 36. Voltage Ven is an enable voltage. Voltages Ven and Vgg are power to carrier amplifier bias circuit 22. Terminal t3 is connected to terminal t4 of second monolithic semiconductor device 19 via carrier-amplifier bias power supply wiring 31.

Second monolithic semiconductor device 19 includes: first transistor Tr1 for power amplification provided on multilayer submount substrate 100; and carrier amplifier bias circuit 22 that includes second transistor Tr2 provided on multilayer submount substrate 100 and applies a bias voltage to the gate of first transistor Tr1. First transistor Tr1 and second transistor Tr2 each are a high-electron-mobility transistor (HEMT) that includes a nitride semiconductor such as gallium nitride (GaN), but the present disclosure is not limited to this example.

Carrier amplifier bias circuit 22 includes resistor R1, second transistor Tr2, and resistor R2 that are connected in series. A connection point between one end of resistor R1 and the drain of second transistor Tr2 is equivalent to a bias voltage output node of carrier amplifier bias circuit 22, and is connected to the gate of first transistor Tr1. The other end of resistor R1 is grounded. Second transistor Tr2 is disposed outside a transmission path for radio-frequency signals inputted to first transistor Tr1. It should be noted that the transmission path for radio-frequency signals is a path on which most of the radio-frequency signals inputted to terminal t6 via first radio-frequency signal wiring 1 are transmitted. One end of resistor R2 is connected to the gate of second transistor Tr2, and the other end of resistor R2 is connected to the source of second transistor Tr2.

Furthermore, second monolithic semiconductor device 19 includes: terminal t4 connected to the one end of resistor R2; terminal t5 connected to carrier amplifier power supply wiring 43; terminal t6 connected to the gate of first transistor Tr1; and terminal t7 connected to the drain of first transistor Tr1. It should be noted that the source of first transistor Tr1 is grounded.

When Low voltage is inputted as voltage Ven to terminal t1 of bias power supply semiconductor device 13, a voltage lower than a threshold voltage of second transistor Tr2 is outputted from terminal t3 and inputted to the one end of resistor R2. As a result, a gate voltage of second transistor Tr2 becomes lower than the threshold voltage of second transistor Tr2, and second transistor Tr2 is put into an off state in which no drain current flows.

In contrast, when High voltage is inputted as voltage Ven to terminal t1 of bias power supply semiconductor device 13, a voltage higher than a threshold voltage of second transistor Tr2 is outputted from bias power supply semiconductor device 13 and applied to the one end of resistor R2. The voltage applied to the one end of resistor R2 causes a gate voltage of second transistor Tr2 to be higher than the threshold voltage of second transistor Tr2, and second transistor Tr2 is put into an on state in which a drain current flows.

As stated above, in Embodiment 8, first transistor Tr1 as an amplifier and second transistor Tr2 that generates a bias voltage are included in the same chip. Second transistor Tr2 has the same device property as first transistor Tr1. Accordingly, since it is possible to cancel a variation in threshold voltages of first transistor Tr1 and second transistor Tr2, it is possible to control the operation of first transistor Tr1 with high accuracy.

It should be noted that although carrier amplifier bias circuit 22 shown in FIG. 9B is an example of a circuit that supplies a bias voltage to the gate of first transistor Tr1, a circuit configuration is not limited to this example. For example, the other end of resistor R1 need not be grounded, and a voltage generated by bias power supply semiconductor device 13 may be applied to the other end of resistor R1.

It should be noted that bias power supply semiconductor device 13 shown in FIG. 1A etc. may have both the configurations of bias power supply semiconductor device 13 and carrier amplifier bias circuit 22 shown in FIG. 9B.

Figure 10A:
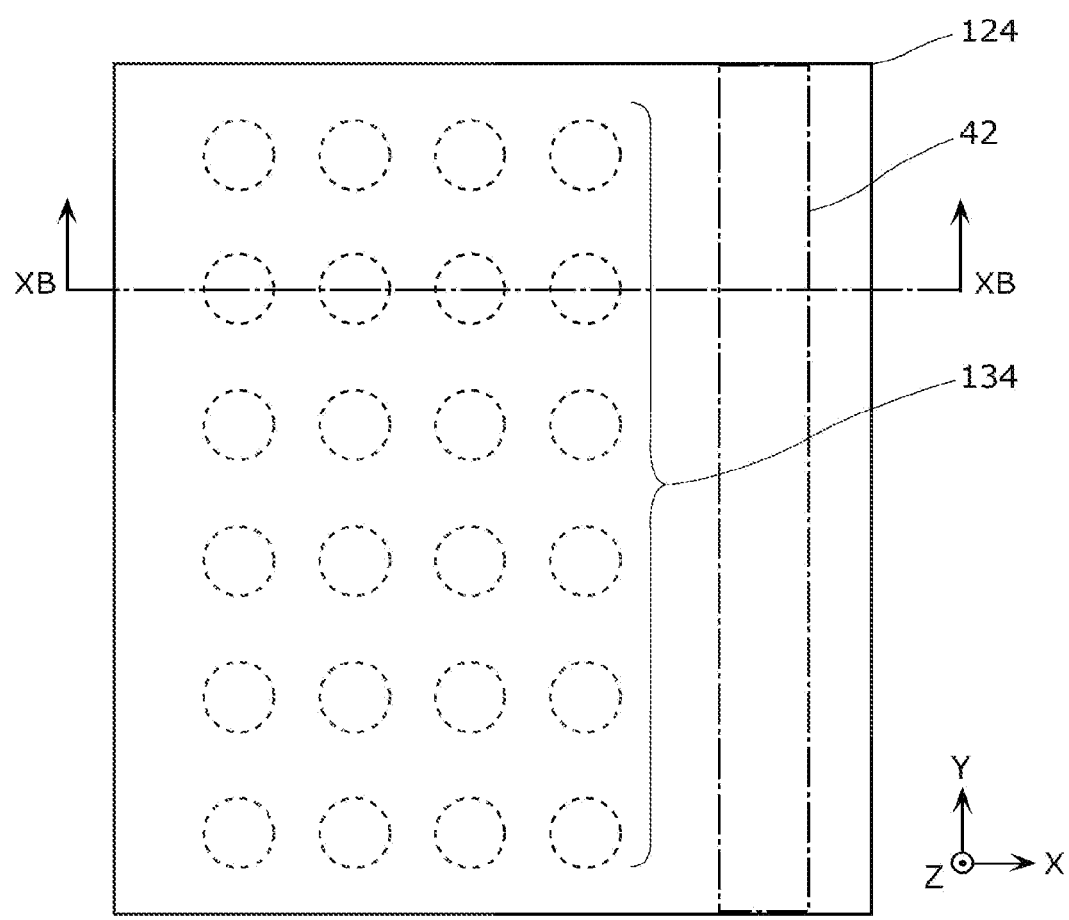
FIG. 10A is a perspective view of an example of a pattern of driver amplifier power supply wiring according to Embodiment 8.
Figure 10B:
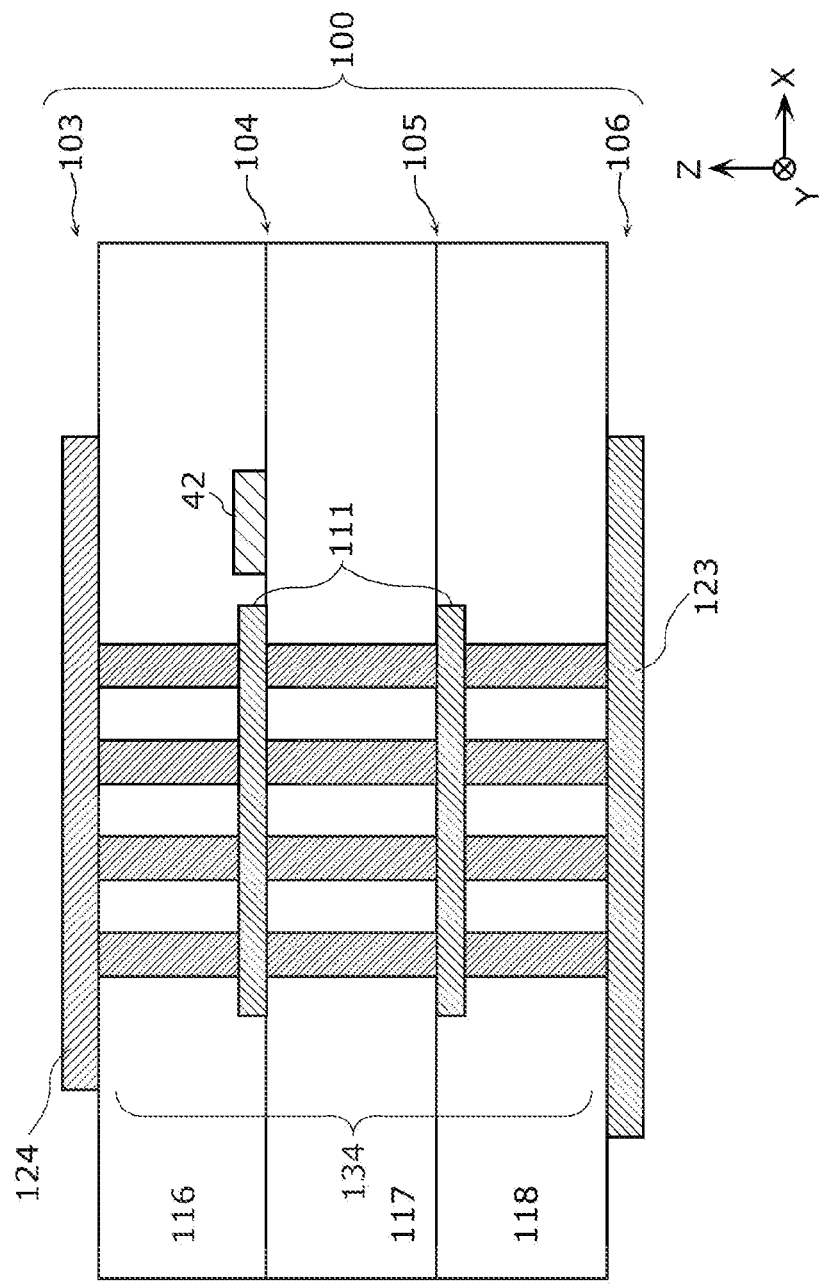
FIG. 10B shows an example of a cross sectional structural view of the pattern of the driver amplifier power supply wiring according to Embodiment 8, taken along section line XB-XB in FIG. 10A.

Next, a pattern of driver amplifier power supply wiring will be described with reference to FIG. 10A and FIG. 10B. FIG. 10A is a perspective view of an example of a pattern of driver amplifier power supply wiring according to Embodiment 8. FIG. 10B shows an example of a cross sectional structural view of the pattern of the driver amplifier power supply wiring according to Embodiment 8, taken along section line XB-XB in FIG. 10A.

As shown in FIG. 10A and FIG. 10B, peak driver amplifier power supply wiring 42 that supplies power to peak driver amplifier semiconductor device 16 is disposed on second wiring layer 104 that is a lower layer, on which first monolithic semiconductor device 18, of die pad 124 provided in first wiring layer 103 of multilayer submount substrate 100 is disposed. In addition, peak driver amplifier power supply wiring 42 is disposed to stay within an outer perimeter boundary of die pad 124 in a direction (the X-axis direction in the example shown in FIG. 10A) orthogonal to an extension direction (the Y-axis direction in the example shown in FIG. 10A) of carrier driver amplifier power supply wiring 41 or peak driver amplifier power supply wiring 42 in a plan view of radio-frequency power amplifier device 700. In the examples shown in FIG. 10A and FIG. 10B, die pad 124 encompasses peak driver amplifier power supply wiring 42 in a plan view.

There is a possibility that the protrusion of peak driver amplifier power supply wiring 42 beyond the outer perimeter boundary causes interference with the first or second radio-frequency signal, and the properties degrade. Disposing peak driver amplifier power supply wiring 42 in the wiring layer that is the lower layer of die pad 124 enables die pad 124 to serve as a shield pattern and reduce interference between peak driver amplifier power supply wiring 42 and the first or second radio-frequency signal.

Although peak driver amplifier power supply wiring 42 is disposed in second wiring layer 104 in the above configuration, peak driver amplifier power supply wiring 42 may be provided in a further lower wiring layer (e.g., third wiring layer 105).

It should be noted that thermal via 134 is a via for thermally connecting ground electrode pattern 123 and die pad 124.

Embodiment 9

Figure 11:
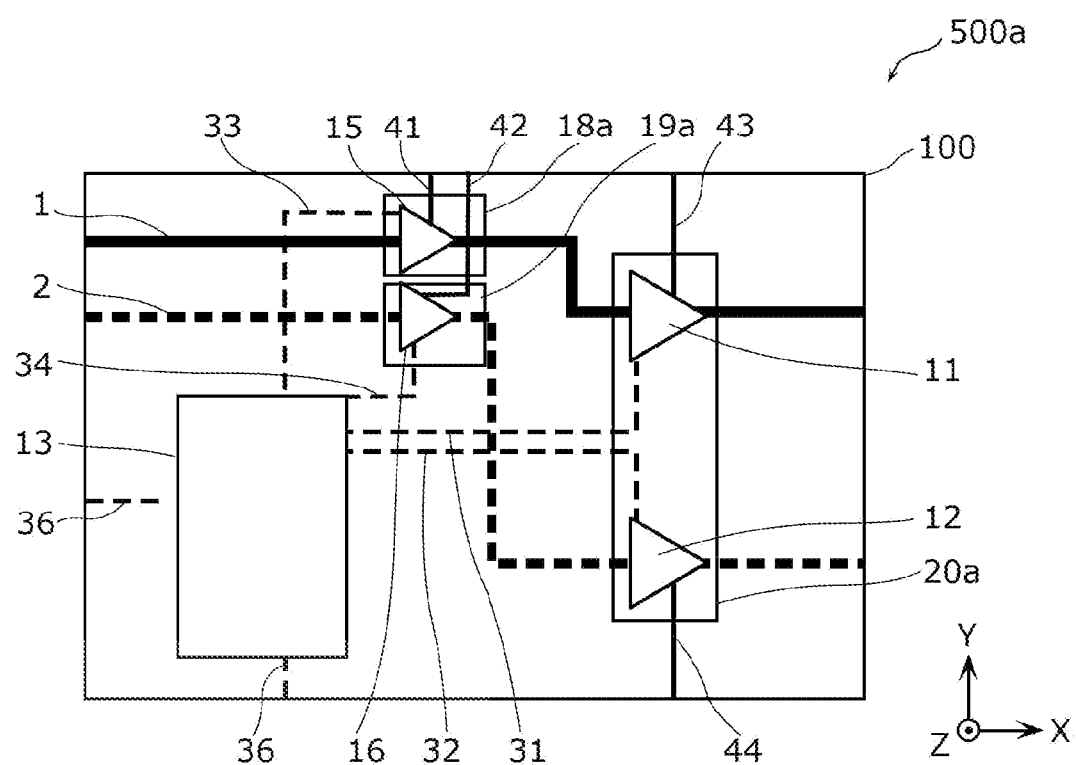
FIG. 11 shows an example of a plan view of a radio-frequency power amplifier device according to Embodiment 9.

FIG. 11 shows an example of a plan view of radio-frequency power amplifier device 500a according to Embodiment 9.

As shown in FIG. 11, a driver amplifier semiconductor device includes: carrier driver amplifier semiconductor device 15 that is a pre-amplifier for carrier amplifier semiconductor device 11 and is first monolithic semiconductor device 18a; and peak driver amplifier semiconductor device 16 that is a pre-amplifier for peak amplifier semiconductor device 12 and is second monolithic semiconductor device 19a. Additionally, carrier driver amplifier semiconductor device 11 and peak amplifier semiconductor device 12 are included in third monolithic semiconductor device 20a.

The above configuration makes it easy to lay out a parallel-plate coupler (parallel-plate type coupler) that divides a radio-frequency signal into the first radio-frequency signal to be inputted to carrier driver amplifier semiconductor device 15 and the second radio-frequency signal to be inputted to peak driver amplifier semiconductor device 16. It should be noted that in the example shown in FIG. 11, the parallel-plate coupler is disposed outside radio-frequency power amplifier device 500a.

Embodiment 10

Although Embodiment 9 has described the example in which the parallel-plate coupler is disposed outside radio-frequency power amplifier device 500a, a parallel-plate coupler may be mounted on a radio-frequency power amplifier device. In Embodiment 10, a radio-frequency power amplifier device on which a parallel-plate coupler is mounted will be described with reference to FIG. 12A and FIG. 12B.

Figure 12A:
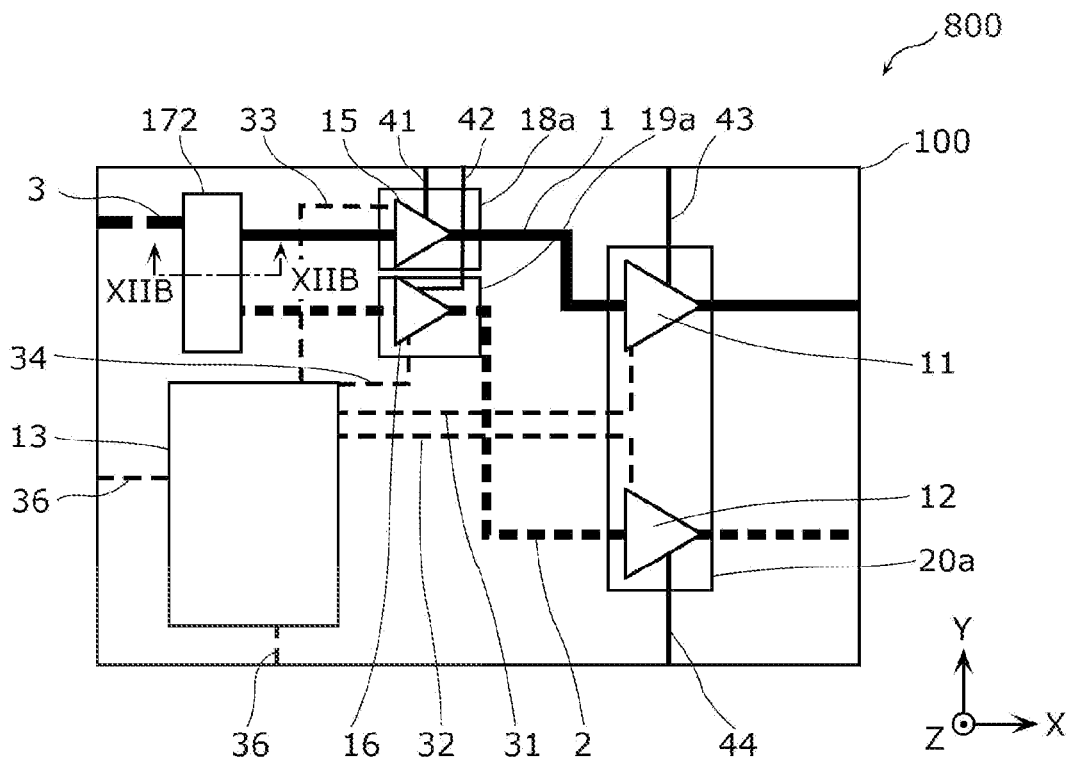
FIG. 12A shows an example of a plan view of a radio-frequency power amplifier device according to Embodiment 10.
Figure 12B:
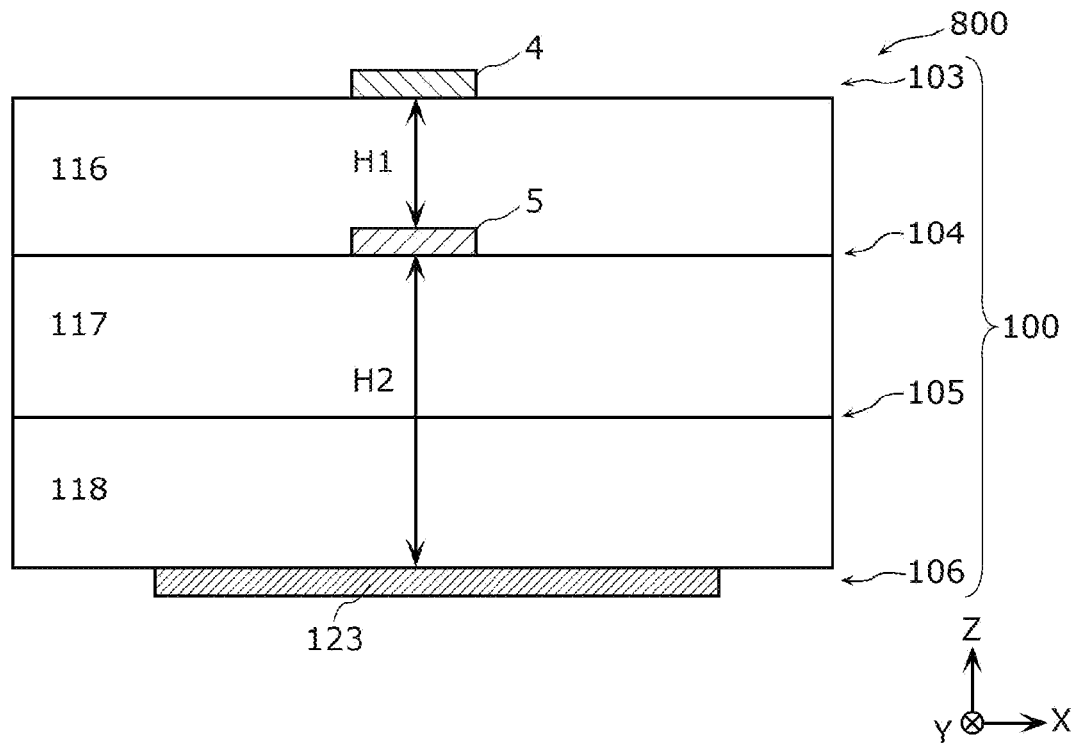
FIG. 12B shows an example of a cross sectional structural view of a parallel-plate coupler according to Embodiment 10, taken along section line XIIB-XIIB in FIG. 12A.

FIG. 12A shows an example of a plan view of radio-frequency power amplifier device 800 according to Embodiment 10. FIG. 12B shows an example of a cross sectional structural view of a parallel-plate coupler according to Embodiment 10, taken along section line XIIB-XIIB in FIG. 12A.

As shown in FIG. 12A, radio-frequency power amplifier device 800 includes divider 172 that is a pre-amplifier for carrier driver amplifier semiconductor device 15 and peak driver amplifier semiconductor device 16. Divider 172 divides a third radio-frequency signal inputted from third radio-frequency signal wiring 3 into a first radio-frequency signal to be inputted to carrier driver amplifier semiconductor device 15 and a second radio-frequency signal to be inputted to peak driver amplifier semiconductor device 16. In Embodiment 10, divider 172 includes a parallel-plate coupler.

As shown in FIG. 12B, radio-frequency power amplifier device 800 includes the parallel-plate coupler provided between main line 4 provided in first wiring layer 103 of multilayer submount substrate 100 and sub-line 5 provided in second wiring layer 104 that faces first wiring layer 103. Space H2 between sub-line 5 included in the parallel-plate coupler and fourth wiring layer 106 that is set to a ground electric potential and faces and is closest to sub-line 5 may be at least three times as large as space H1 between main line 4 and sub-line 5 included in the parallel-plate coupler. Such a configuration makes it easy to provide a parallel-plate 3 dB coupler. It should be noted that by at least one of adjusting the thickness of each resin layer or adjusting the number of layers of multilayer submount substrate 100, it is possible to adjust space H1 and space H2. At least one of the thickness of each resin layer or the number of layers of multilayer submount substrate 100 is adjusted to cause space H2 to be at least three times as large as space H1.

It should be noted that although divider 172 includes the parallel-plate coupler in FIG. 12B, it is entirely acceptable to cause radio-frequency power amplifier device 800 to contain a Wilkinson coupler instead of the parallel-plate coupler.

Moreover, in Embodiment 10, carrier driver amplifier power supply wiring 41 that supplies power to carrier driver amplifier semiconductor device 15 may be disposed in a wiring layer that is a lower layer, on which second monolithic semiconductor device 19a is disposed, of die pad 124 (see FIG. 10A and FIG. 10B) provided in first wiring layer 103 of multilayer submount substrate 100. Alternatively, peak driver amplifier power supply wiring 42 that supplies power to peak driver amplifier semiconductor device 16 may be disposed in a wiring layer that is a lower layer, on which first monolithic semiconductor device 18a is disposed, of die pad 124 provided in first wiring layer 103 of multilayer submount substrate 100.

In a plan view of radio-frequency power amplifier device 800, carrier driver amplifier power supply wiring 41 or peak driver amplifier power supply wiring 42 may be disposed to stay within the outer perimeter boundary of die pad 124 in a direction orthogonal to the extension direction of carrier driver amplifier power supply wiring 41 or peak driver amplifier power supply wiring 42.

As stated above, even when carrier amplifier semiconductor device 11 and peak amplifier semiconductor device 12 are included in a single chip, die pad 124 may be used as a shield pattern of at least one of carrier driver amplifier power supply wiring 41 or peak driver amplifier power supply wiring 42.

Although one or more radio-frequency power amplifier devices according to one or more aspects of the present disclosure have been described above based on the respective embodiments, the present disclosure is not limited to these embodiments. Forms obtained by making various modifications conceived by a person skilled in the art to the embodiments or forms obtained by combining the constituent elements in the different embodiments may be included in the scope of the one or more aspects of the present disclosure, as long as they do not depart from the essence of the present disclosure.

Moreover, with regard to the one or more radio-frequency power amplifier devices according to the one or more aspects of the present disclosure, carrier amplifier semiconductor device 11 and peak amplifier semiconductor device 12 may each include a transistor comprising a nitride such as GaN. A Si substrate, a SiC substrate, etc. may be used as a semiconductor substrate.

Furthermore, carrier amplifier semiconductor device 11 and peak amplifier semiconductor device 12 may each include a LDMOS transistor including a Si substrate.

Moreover, carrier amplifier semiconductor device 11 and carrier driver amplifier semiconductor device 15 may each include a transistor comprising a nitride such as GaN. A Si substrate, a SiC substrate, etc. may be used as a semiconductor substrate.

Furthermore, carrier amplifier semiconductor device 11 and carrier driver amplifier semiconductor device 15 may each include a LDMOS transistor including a Si substrate.

Moreover, peak amplifier semiconductor device 12 and peak driver amplifier semiconductor device 16 may each include a transistor comprising a nitride such as GaN. A Si substrate, a SiC substrate, etc. may be used as a semiconductor substrate.

Furthermore, carrier amplifier semiconductor device 12 and peak driver amplifier semiconductor device 16 may each include a LDMOS transistor including a Si substrate.

Moreover, carrier amplifier semiconductor device 11 and peak amplifier semiconductor device 12 may each include, for example, a transistor comprising a nitride such as GaN and a LDMOS transistor including a Si substrate. A substrate used for a semiconductor substrate of carrier amplifier semiconductor device 11 may have a superior (higher) thermal conductivity than a substrate used for a semiconductor substrate of peak amplifier semiconductor device 12 does. As an example, a SiC substrate may be used for the semiconductor substrate of carrier amplifier semiconductor device 11, and a Si substrate may be used for the semiconductor substrate of peak amplifier semiconductor device 12. As another example, a transistor comprising a nitride provided on a SiC substrate may be used for carrier amplifier semiconductor device 11, and a transistor comprising a nitride provided on a Si substrate may be used for peak amplifier semiconductor device 12. Such a configuration makes it possible to decrease a channel temperature of carrier amplifier semiconductor device 11. Additionally, using a SiC substrate more expensive than a Si substrate only for carrier amplifier semiconductor device 11 that generates a lot of heat makes it possible to reduce costs.

Furthermore, carrier amplifier semiconductor device 11 and carrier driver amplifier semiconductor device 15 may each include, for example, a transistor comprising a nitride such as GaN and a LDMOS transistor including a Si substrate. A substrate used for a semiconductor substrate of carrier amplifier semiconductor device 11 may have a superior (higher) thermal conductivity than a substrate used for a semiconductor substrate of carrier driver amplifier semiconductor device 15 does. As an example, a SiC substrate may be used for the semiconductor substrate of carrier amplifier semiconductor device 11, and a Si substrate may be used for the semiconductor substrate of carrier driver amplifier semiconductor device 15. As another example, a transistor comprising a nitride provided on a SiC substrate may be used for carrier amplifier semiconductor device 11, and a transistor comprising a nitride provided on a Si substrate may be used for carrier driver amplifier semiconductor device 15. Such a configuration makes it possible to decrease a channel temperature of carrier amplifier semiconductor device 11. Additionally, using a SiC substrate more expensive than a Si substrate only for carrier amplifier semiconductor device 11 that generates a lot of heat makes it possible to reduce costs.

Moreover, a transistor comprising a nitride such as GaN on a Si substrate may be used for carrier amplifier semiconductor device 11, and a transistor including a LDMOS on a Si substrate may be used for peak amplifier semiconductor device 12. By causing the semiconductor substrates to be identical Si substrates, it is possible to form carrier amplifier semiconductor device 11 and peak amplifier semiconductor device 12 into a single chip.

Furthermore, a transistor comprising a nitride such as GaN on a Si substrate may be used for carrier amplifier semiconductor device 11, and a transistor including a LDMOS on a Si substrate may be used for carrier driver amplifier semiconductor device 15. By causing the semiconductor substrates to be identical Si substrates, it is possible to form carrier amplifier semiconductor device 11 and carrier driver amplifier semiconductor device 15 into a single chip.

INDUSTRIAL APPLICABILITY

The radio-frequency power amplifier device according to the present disclosure is useful for a radio-frequency power amplifier device on which a Doherty amplifier and a bias power supply semiconductor device that supplies a power supply voltage to the Doherty amplifier are mounted.

REFERENCE SIGNS LIST

1 first radio-frequency signal wiring
2 second radio-frequency signal wiring
3 third radio-frequency signal wiring
4 main line
5 sub-line
11 carrier amplifier semiconductor device
12 peak amplifier semiconductor device
13 bias power supply semiconductor device
13a switch element
14 driver amplifier semiconductor device
15 carrier driver amplifier semiconductor device
16 peak driver amplifier semiconductor device
17 microcontroller unit semiconductor device
18, 18a first monolithic semiconductor device
19, 19a second monolithic semiconductor device
20, 20a third monolithic semiconductor device
21 first gate bias circuit
22 carrier amplifier bias circuit
23 peak amplifier bias circuit
24 carrier driver amplifier bias circuit
25 peak driver amplifier bias circuit
31 carrier-amplifier bias power supply wiring
32 peak-amplifier bias power supply wiring
33 carrier-driver-amplifier bias power supply wiring
34 peak-driver-amplifier bias power supply wiring
35 digital signal wiring 36 analog power supply wiring
41 carrier driver amplifier power supply wiring
42 peak driver amplifier power supply wiring
43 carrier amplifier power supply wiring
44 peak amplifier power supply wiring
100 multilayer submount substrate
100a, 100b, 100c intersection portion
101 first principal surface
102 second principal surface
103 first wiring layer
104 second wiring layer
105 third wiring layer
106 fourth wiring layer
107 first wiring pattern
108 second wiring pattern
109 third wiring pattern
110 fourth wiring pattern
111 connection via pattern
116 first resin layer
117 second resin layer
118 third resin layer
121 first shield pattern
122 second shield pattern
123 ground electrode pattern
124 die pad
131 connection via
132 radio-frequency signal connection via
133 bias power supply connection via
134 thermal via
141 first connecting wire
142 second connecting wire
143 third connecting wire
144 fourth connecting wire
145 fifth connecting wire
150 transistor
151 gate electrode
152 resistor
153 drain electrode
154 source electrode
161 input terminal
162 output terminal
171, 172 divider
200, 300, 400, 500, 500a, 600, 700, 800 radio-frequency power amplifier
H1, H2, P space
R1, R2 resistor
t1, t2, t3, t4, t5, t6, t7 terminal
Tr1 first transistor
Tr2 second transistor
W width

The invention claimed is:

1. A radio-frequency power amplifier device that is a radio-frequency power amplifier device of a hybrid type in which a carrier amplifier semiconductor device and a peak amplifier semiconductor device are disposed on a principal surface of a multilayer submount substrate, the multilayer submount substrate including a plurality of resin layers and a plurality of wiring layers, the radio-frequency power amplifier device comprising:
  radio-frequency signal wiring that is wired in a first wiring layer provided on the principal surface, and transmits a radio-frequency signal to the carrier amplifier semiconductor device or the peak amplifier semiconductor device; and
  bias power supply wiring that is wired in a wiring layer lower than the first wiring layer of the multilayer submount substrate, and supplies a carrier-amplifier bias power supply voltage to the carrier amplifier semiconductor device or supplies a peak-amplifier bias power supply voltage to the peak amplifier semiconductor device,
  wherein the carrier amplifier semiconductor device includes a first semiconductor substrate,
  the peak amplifier semiconductor device includes a second semiconductor substrate having a thermal conductivity lower than a thermal conductivity of the first semiconductor substrate, and
  the multilayer submount substrate includes an intersection portion in which, in a plan view of the multilayer submount substrate, the radio-frequency signal wiring and the bias power supply wiring intersect.

2. The radio-frequency power amplifier device according to claim 1,
  wherein the intersection portion includes:
    a shield pattern that is provided in a wiring layer disposed between the radio-frequency signal wiring and the bias power supply wiring and is set to a ground electric potential; and
    a ground connection via that is disposed on each of both sides of a width of the bias power supply wiring, within a distance from the bias power supply wiring that is three times as large as the width of the bias power supply wiring in an extension direction of the bias power supply wiring, and is set to a ground electric potential.

3. The radio-frequency power amplifier device according to claim 1,
  the first semiconductor substrate includes SiC, and
  the second semiconductor substrate includes Si.

4. The radio-frequency power amplifier device according to claim 3,
  wherein the carrier amplifier semiconductor device includes a nitride transistor.

5. The radio-frequency power amplifier device according to claim 3,
  wherein the peak amplifier semiconductor device includes a nitride transistor.

6. The radio-frequency power amplifier device according to claim 1, further comprising:
  a driver amplifier semiconductor device on the principal surface of the multilayer submount substrate, the driver amplifier semiconductor device being a pre-amplifier for the carrier amplifier semiconductor device and the peak amplifier semiconductor device.

7. The radio-frequency power amplifier device according to claim 6,
  wherein the driver amplifier semiconductor device includes a nitride transistor.

8. The radio-frequency power amplifier device according to claim 6,
  wherein a semiconductor substrate of the driver amplifier semiconductor device includes Si.

9. The radio-frequency power amplifier device according to claim 6,
  wherein the driver amplifier semiconductor device includes a carrier driver amplifier that is a pre-amplifier for the carrier amplifier semiconductor device, and a peak driver amplifier that is a pre-amplifier for the peak amplifier semiconductor device.

10. A radio-frequency power amplifier device that is a radio-frequency power amplifier device of a hybrid type in which a carrier amplifier semiconductor device and a peak amplifier semiconductor device are disposed on a principal surface of a multilayer submount substrate, the multilayer submount substrate including a plurality of resin layers and a plurality of wiring layers, the radio-frequency power amplifier device comprising:

radio-frequency signal wiring that is wired in a first wiring layer provided on the principal surface, and transmits a radio-frequency signal to the carrier amplifier semiconductor device or the peak amplifier semiconductor device; and bias power supply wiring that is wired in a wiring layer lower than the first wiring layer of the multilayer submount substrate, and supplies a carrier-amplifier bias power supply voltage to the carrier amplifier semiconductor device or supplies a peak-amplifier bias power supply voltage to the peak amplifier semiconductor device, wherein the carrier amplifier semiconductor device includes a first semiconductor substrate, the peak amplifier semiconductor device includes a second semiconductor substrate having a thermal conductivity lower than a thermal conductivity of the first semiconductor substrate, and the radio-frequency power amplifier device comprises, on the principal surface of the multilayer submount substrate, a bias power supply semiconductor device that outputs the carrier-amplifier bias power supply voltage or the peak-amplifier bias power supply voltage.

11. The radio-frequency power amplifier device according to claim 10, wherein the first semiconductor substrate includes SiC, and the second semiconductor substrate includes Si.

12. The radio-frequency power amplifier device according to claim 11, wherein the carrier amplifier semiconductor device includes a nitride transistor.

13. The radio-frequency power amplifier device according to claim 11, wherein the peak amplifier semiconductor device includes a nitride transistor.

14. The radio-frequency power amplifier device according to claim 10, further comprising:

a driver amplifier semiconductor device on the principal surface of the multilayer submount substrate, the driver amplifier semiconductor device being a pre-amplifier for the carrier amplifier semiconductor device and the peak amplifier semiconductor device.

15. The radio-frequency power amplifier device according to claim 14, wherein the driver amplifier semiconductor device includes a nitride transistor.

16. The radio-frequency power amplifier device according to claim 14, wherein a semiconductor substrate of the driver amplifier semiconductor device includes Si.

17. The radio-frequency power amplifier device according to claim 14, wherein the driver amplifier semiconductor device includes a carrier driver amplifier that is a pre-amplifier for the carrier amplifier semiconductor device, and a peak driver amplifier that is a pre-amplifier for the peak amplifier semiconductor device.

* * * * *